United States Patent

Noguchi et al.

[11] Patent Number: 6,031,244
[45] Date of Patent: Feb. 29, 2000

[54] LUMINESCENT SEMICONDUCTOR DEVICE WITH ANTIDIFFUSION LAYER ON ACTIVE LAYER SURFACE

[75] Inventors: Hiroyasu Noguchi, Kanagawa; Kazushi Nakano, Tokyo; Akira Ishibashi, Kanagawa; Atsushi Toda, Kanagawa; Satoshi Taniguchi, Kanagawa; Tomonori Hino, Kanagawa; Eisaku Kato, Kanagawa, all of Japan

[73] Assignee: Sony Corporation, Tokyo, Japan

[21] Appl. No.: 08/987,105

[22] Filed: Dec. 8, 1997

[30] Foreign Application Priority Data

Dec. 9, 1996 [JP] Japan .................................... 8-328559
Dec. 30, 1996 [JP] Japan .................................... 8-358289

[51] Int. Cl.$^7$ .................................................. H01L 33/00
[52] U.S. Cl. ................................ 257/22; 257/94; 257/96; 257/103; 257/751
[58] Field of Search ................................ 257/22, 94, 96, 257/103, 751, 13, 17

[56] References Cited

U.S. PATENT DOCUMENTS 5,864,171 1/1999 Yamamoto et al. ....................... 257/94

FOREIGN PATENT DOCUMENTS 8-88197  4/1996  Japan .

Primary Examiner—Minh Loan Tran
Attorney, Agent, or Firm—Hill & Simpson

[57] ABSTRACT

A luminescent semiconductor device comprises: an active layer composed of a Group II–VI semiconductor device which comprises at least one Group II element selected from the group consisting of zinc, magnesium, beryllium, cadmium, manganese and mercury, and at least one Group VI element selected from the group consisting of oxygen, sulfur, selenium and tellurium. the Group II–VI compound semiconductor forming said active layer contains at least one element selected from the group consisting of magnesium, beryllium and cadmium as the Group II element and tellurium as the Group VI element. At least one antidiffusion layer preventing diffusion of these elements from the active layer is provided on at least one surface of the active layer.

46 Claims, 14 Drawing Sheets

LUMINESCENT SEMICONDUCTOR DEVICE WITH ANTIDIFFUSION LAYER ON ACTIVE LAYER SURFACE

BACKGROUND OF THE INVENTION

1. Field of the Invention

The present invention relates to a luminescent semiconductor device having an active layer composed of a Group II–VI compound semiconductor, a method for making the same, and an optical disk apparatus provided with the same.

2. Description of the Related Art

The requirements for optical recording disks and magnetooptical recording disks in recent years include high recording/regenerating density and high resolution, hence semiconductor devices emitting green or blue color have been demanded.

Prospective semiconductors for semiconductor devices emitting green or blue color include Group II–VI compound semiconductors composed of at least one Group II element selected from zinc (Zn), magnesium (Mg), beryllium (Be), cadmium (Cd), and mercury (Hg), and at least one Group VI element selected from oxygen (O), sulfur (S), selenium (Se), and tellurium (Te). Among them, a ZnMgSSe mixed crystal can be deposited on a GaAs substrate composed of gallium (Ga) and arsenic (As), and it has been known that the crystal is suitable for a guide layer or a clad layer in semiconductor laser devices emitting a blue light laser beam (for example, Electron. Lett., 28, p. 1798 (1992); Electron. Lett., 29, p. 1488 (1993); and Appl. Phys. Lett., 66, p. 656 (1995)).

In general, luminescent semiconductor devices have been fabricated by separately depositing a clad layer composed of a ZnMgSSe mixed crystal, a guide layer composed of a ZnSSe mixed crystal or ZnS, and an active layer composed of a ZnCdSe mixed layer on a GaAs substrate (for example, N. Nakayama et al., Electron. Lett., 16, p. 1488 (1993); and S. Taniguchi et al., Electron. Lett., 32, p. 552 (1996)). Such a luminescent semiconductor device is formed by, Group II particle beam radiation and Group VI particle beam radiation by means of, for example, molecular beam epitaxy (MBE), in which a Group VI element is fed in an amount of 1 to 2 times the amount of a Group II element.

In the above-mentioned conventional luminescent semiconductor devices, it has been found that the wavelength of the luminescence becomes short when energized. FIG. 1 is a graph illustrating the results of the energizing test of a luminescent semiconductor device which consists of a clad layer composed of a ZnMgSSe mixed crystal, a guide layer composed of a ZnSSe mixed crystal, and an active layer composed of a ZnCdSe mixed crystal provided between the clad layer and the guide layer. The device was energized at 40° C. for 30 minutes in a 1 mW auto power control (APC) mode. The emission spectrum after energizing was measured by a low-temperature cathode luminescence (CL) method. FIG. 1 includes an emission spectrum at an energized section wherein a current flows by current constriction, and an emission spectrum at a non-energized section wherein no current flows in the luminescent semiconductor device.

As shown in FIG. 1, the emission spectrum from the active layer shifts by 3 nm toward a shorter wavelength by energizing. The same shift due to energizing is also observed in luminescent semiconductor devices having a ZnSe guide layer, although it is not shown in the drawing. It is thought, as shown in FIG. 2, that the shift toward a shorter wavelength due to energizing is caused by electric diffusion of cadmium in the active layer into the guide layer and of zinc in the guide layer into the active layer. Such diffusion results in a decrease in the cadmium content in the ZnCdSe mixed crystal as the constituent of the active layer.

The diffusion of cadmium from the active layer increases the band gap of the active layer, as shown in FIG. 2, and the increased band gap causes an increase in the operating current flow and a decrease in the characteristic temperature due to carrier overflow. Further, dark line defects (DLD) occur at the position of the diffusion. The occurrence of the DLD suggests the formation of crystal defects, such as dislocation, which function as non-luminescent recombining centers increasing the operating current flow, resulting in deterioration of the device. In addition, nonuniform diffusion of cadmium causes an increase in the half-width of the emission spectrum, resulting in a decreased gain and an increased operating current flow.

SUMMARY OF THE INVENTION

It is an object of the present invention to solve problems in the prior art technologies described above.

It is another object of the present invention to provide a luminescent semiconductor device which prevents electrical diffusion of an element in the active layer.

It is a further object of the present invention to provide a method for making the luminescent semiconductor device.

It is still another object of the present invention to provide an optical recording device provided with the luminescent semiconductor device.

A luminescent semiconductor device in accordance with the present invention comprises: an active layer composed of a Group II–VI semiconductor device comprising at least one Group II element selected from the group consisting of zinc, magnesium, beryllium, cadmium, manganese and mercury, and at least one Group VI element selected from the group consisting of oxygen, sulfur, selenium and tellurium; the Group II–VI compound semiconductor forming the active layer containing at least one element selected from the group consisting of magnesium, beryllium and cadmium as the Group II element and tellurium as the Group VI element; at least one antidiffusion layer preventing diffusion of these elements from the active layer being provided on at least one surface of the active layer.

A method for making a luminescent semiconductor device in accordance with the present invention comprises: depositing a plurality of Group II–VI compound semiconductor layers on a substrate by feeding a particle beam of at least one Group II element selected from the group consisting of zinc, magnesium, beryllium, cadmium and mercury, and a particle beam of at least one Group VI element selected from the group consisting of oxygen, sulfur, selenium and tellurium, wherein the Group VI element is fed in an amount smaller than that of the fed Group II element so that the active layer and at least a region, facing the active layer, of at least one Group II–VI compound semiconductor layer adjoining the active layer.

An optical recording device in accordance with the present invention comprises: a luminescent semiconductor device comprising a Group II–VI compound semiconductor active layer composed of at least one Group II element selected from the group consisting of zinc, magnesium, beryllium, cadmium and mercury, and at least one Group VI element selected from the group consisting of oxygen, sulfur, selenium and tellurium, wherein at least one antidiffusion layer preventing diffusion of these elements from the active layer is provided on at least one surface of the active layer.

The luminescent semiconductor device emits light from the active layer by an electric current flow. The antidiffusion prevents diffusion of an element from the active layer. The composition of the active layer therefore does not change and the wavelength of the emitted light is constant with time.

In the method for making the luminescent semiconductor device, particle beams of the Group II element and particle beams of the Group VI element are fed to deposit a Group II–VI compound semiconductor active layer and other layers. In the deposition of the active layer and at least one neighboring layer, the Group VI element is fed in an amount smaller than that of the fed Group II element.

In the optical recording device, the active layer in the luminescent semiconductor device emits light when a voltage is applied to the luminescent semiconductor device. The antidiffusion layer prevents diffusion of the element from the active layer due to the current flow. The composition of the active layer therefore does not change and the wavelength of the emitted light is constant with time.

DESCRIPTION OF THE PREFERRED EMBODIMENTS

Preferred embodiments in accordance with the present invention will now be described with reference to the drawings.

[First Embodiment]

Figure 3:
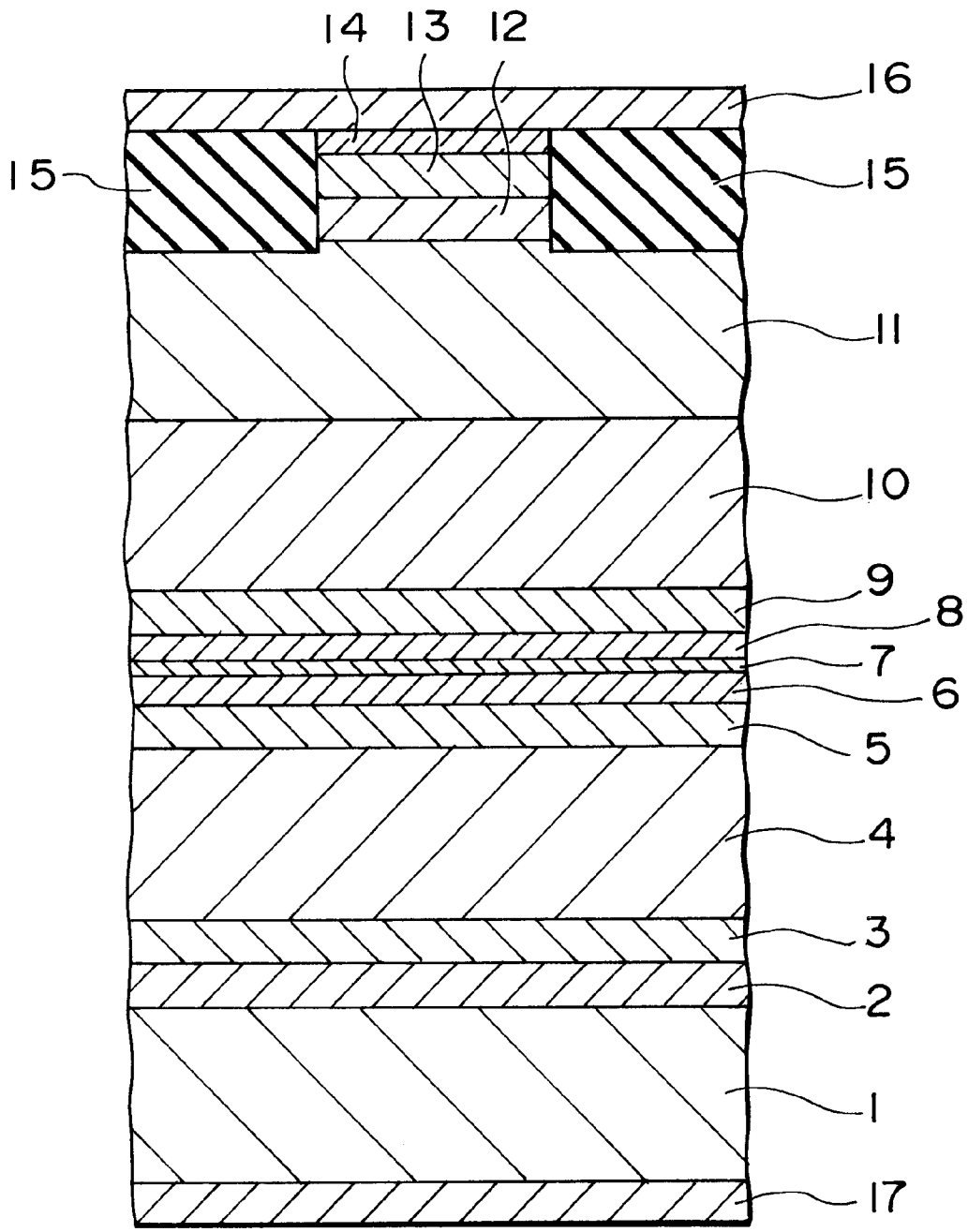
FIG. 3 is a cross-sectional view of a luminescent semiconductor device in accordance with a first embodiment of the present invention.

FIG. 3 is a cross-sectional view of a semiconductor device in accordance with a first embodiment of the present invention. The semiconductor device includes a substrate 1, a Group III–V buffer layer 2, a Group II–VI buffer layer 3, a first clad layer 4, a first guide layer 5, an antidiffusion layer 6, an active layer 7, an antidiffusion layer 8, a second guide layer 9, a second clad layer 10, a first semiconductor layer 11, a second semiconductor layer 12, a superlattice semiconductor layer 13, and a contact layer 14, these layers being deposited on the substrate 1 in that order.

The substrate 1 is composed of, for example, n-GaAs containing silicon (Si) as an n-type impurity having a thickness of 350 $\mu$m. The Group III–V buffer layer 2 is composed of, for example, n-GaAs containing silicon as an n-type impurity and having a thickness of 20 nm.

The Group II–VI buffer layer 3 is composed of, for example, n-ZnSe containing chlorine (Cl) as an n-type impurity and having a thickness of 20 nm. The first clad layer 4 is composed of, for example, an n-ZnMgSSe mixed crystal containing chlorine as an n-type impurity and having a thickness of 1 $\mu$m. The first guide layer 5 is composed of, for example, a ZnSSe mixed crystal having a thickness of 100 nm. The mixed crystal has a ratio of the Group VI elements of 6% sulfur and 94% selenium, in accordance with the lattice constant of GaAs as the constituent of the substrate 1.

The antidiffusion layers 6 and 8 are composed of, for example, a ZnMgSSe mixed crystal having a thickness of 5 nm. The active layer 7 is composed of, for example, a ZnCdSe mixed crystal having a thickness of 6 nm and a single quantum well structure, in a ratio of the Group II elements of 80% zinc and 20% cadmium. The second guide layer 9 is composed of, for example, a ZnSSe mixed crystal having a thickness of 100 nm in a ratio of the Group VI elements of 6% sulfur and 94% selenium. The clad layer 10 is composed of, for example, a p-ZnMgSSe mixed crystal containing nitrogen (N) as a p-type impurity and having a thickness of 1 $\mu$m.

The first semiconductor layer 11 is composed of, for example, a p-ZnSSe mixed crystal containing nitrogen as a p-type impurity and having a thickness of 1 $\mu$m. The second semiconductor layer is composed of, for example, a p-ZnSe containing nitrogen as a p-type impurity and having a thickness of 100 nm. The superlattice semiconductor layer 13 is composed of, for example, p-ZnTe layers containing nitrogen as a p-type impurity and p-ZnSe layers containing nitrogen as a p-type impurity which are alternately deposited on each other. The contact layer 14 is composed of p-ZnTe containing nitrogen as a p-type impurity.

The antidiffusion layers 6 and 8 composed of a Group II–VI compound semiconductor (ZnMgSSe mixed crystal) has a melting point higher than that of the active layer 7 composed of a Group II–VI compound semiconductor (ZnCdSe mixed crystal). These antidiffusion layers 6 and 8 prevent diffusion of the constituents, and particularly cadmium, in the active layer 7 into the antidiffusion layers 6 and 8, and the constituents in the antidiffusion layers 6 and 8 do not diffuse into the active layer. The activation energy Q for diffusion bears close relation to the melting point Tm, as shown in the following equation (1), that is, the higher the melting point Tm, the higher the activation energy Q for diffusion. Diffusion will barely occur at a higher activation energy Q.

$$Q/Tm=36 cal/K \tag{1}$$

The equation (1) is empirically derived (refer to page 121 of "Kinzoku Butsurigaku Joron (Introduction to Physics of Metal)" by S. Kohda (Corona Co., Ltd.).

Another equation (2) applies to cubic crystals:

$$D=(1/6)(F\alpha^2 zv)exp(S/k)exp(-Q/kT) \tag{2}$$

wherein F is a correlation factor, $\alpha$ is the jump distance, z is the number of the nearest atoms or coordination number, v is the frequency of the atom, S is the activation entropy for diffusion, k is Boltzmann's constant, and T is temperature.

Figure 4:
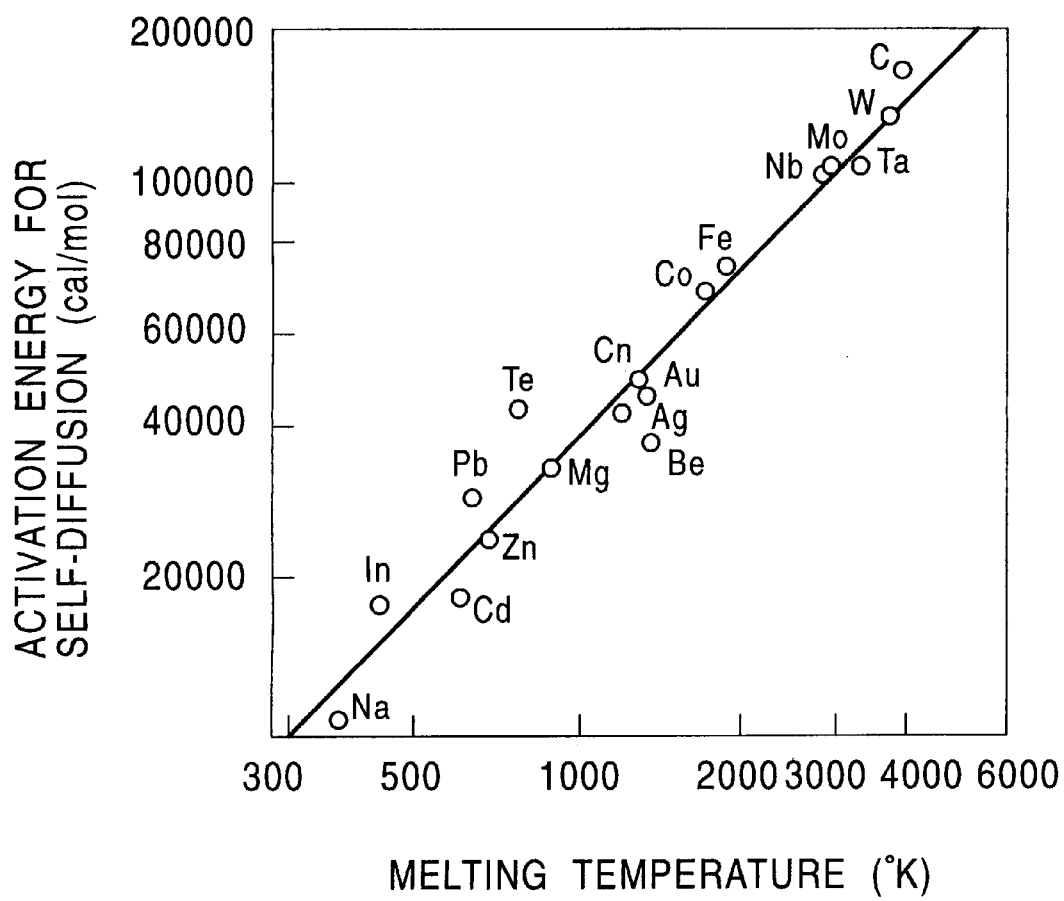
FIG. 4 is a graph illustrating the correlation between the melting point and the activation energy in various metals.

FIG. 4 is a graph illustrating the correlation between the melting point and the activation energy for diffusion in various metals. As shown in FIG. 4, the Group II elements, e.g. magnesium and beryllium and the Group VI elements, e.g. tellurium have higher melting points Tm which are two or more times those of the Group II elements, e.g. zinc and cadmium, and thus have higher activation energies Q. Mixed crystals have a correlation represented by the following equation (3):

$$MgS \text{ (higher than } 2,000° \text{ C.)} > ZnS \text{ } (1,830° \text{ C.}) > ZnSe \text{ } (1,520° \text{ C.}) > CdSe \text{ } (1,264° \text{ C.}) \tag{3}$$

As shown in the equation (3), the ZnMgSSe mixed crystal has a higher melting point compared to the ZnSSe mixed crystal, ZnSe, and the ZnCdSe mixed crystal which have been generally used as active layers in Group II–VI compound semiconductors, and thus is suitable for the constituent of the antidiffusion layers 6 and 8. Group II–VI compound semiconductors, which contain beryllium or tellurium having a higher melting point like magnesium instead of or together with magnesium, are also suitable for the constituent of the antidiffusion layers 6 and 8. Tellurium, a Group VI element, is effective for preventing the diffusion of Group VI elements.

Each of the second semiconductor layer 12, the superlattice semiconductor layer 13 and the contact layer 14 is a stripe with a width of, for example, 10 $\mu$m to constrict the current flow. An insulating layer 15 composed of, for example, alumina ($Al_2O_3$) is formed on the insulating region of the first semiconductor layer 11, wherein the second semiconductor layer 12, the superlattice semiconductor layer 13 and the contact layer 14 are not provided on the insulating region.

A p-side electrode 16 is provided over the insulating layer 15 and the contact layer 14. The p-side electrode 16 is formed by, for example, depositing a palladium (Pd) layer having a thickness of 10 nm, a platinum (Pt) layer having a thickness of 100 nm and a gold (Au) layer having a thickness of 300 nm in that order on the insulating layer 15 and the contact layer 14. An n-side electrode 17 composed of indium (In) is provided on the bottom or rear face of the substrate 1.

The luminescence semiconductor device having such a configuration is produced by the following process.

Figure 5:
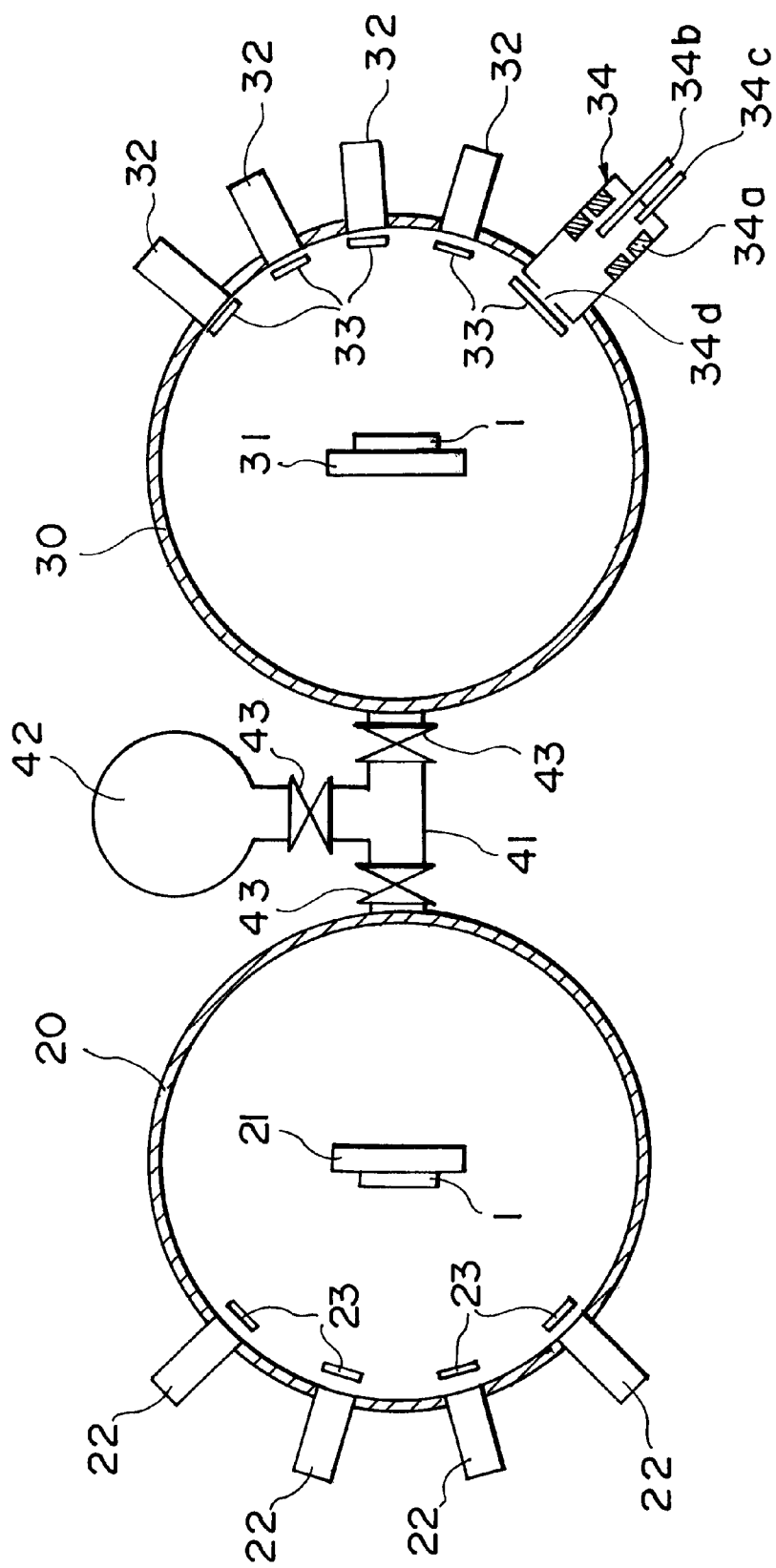
FIG. 5 is a schematic configurational view of a MBE crystal deposition system used in production of the luminescent semiconductor device shown in FIG. 3.

FIG. 5 is a schematic configurational view of a MBE crystal deposition system used in the production of a luminescent semiconductor device in accordance with the present invention. The MBE crystal deposition system belongs to a vacuum deposition system, and is provided with two deposition chambers 20 and 30, each connected to an ultra-high vacuum evacuator not shown in the drawings. These deposition chambers 20 and 30 are connected to a vacuum transfer chamber 41 and a substrate supply chamber 42 with three gate valves 43. These gate valves 43 are provided so as to prevent the substrate surface from being contaminated by residual particle beams in each deposition chamber during transferring it and to maintain the vacuum transfer chamber to a high vacuum.

The deposition chamber 20 is provided for depositing a Group III–V compound semiconductor layer, and a substrate holder 21 holding the substrate 1 is provided in the deposition chamber 20. The substrate holder 21 can be heated with a heater not shown in the drawing. A plurality of particle beam cells 22, for example, Knudsen cells (hereinafter referred to as K cells), are provided in the deposition chamber 20 so as to face the substrate 1. Each of the particle beam cells 22 is filled with a Group III element, a Group V element, or an n-type impurity. Examples of the Group III elements include gallium and aluminum (Al), examples of the Group V elements include arsenic and phosphorus (P), and examples of the n-type impurities include silicon (Si). A shutter 23 is provided near each particle beam cell 22. The shutter 23 is connected to a control unit not shown in the drawing to open and close the shutter 23.

The deposition chamber 30 is provided for depositing a Group II–VI compound semiconductor layer, and a substrate holder 31 holding the substrate 1 is provided in the deposition chamber 30. The substrate holder 31 can be heated with a heater not shown in the drawing. A plurality of particle beam cells 32, for example, K cells, are provided in the deposition chamber 30 so as to face the substrate 1. Each of the particle beam cells 32 is filled with a Group II element, a Group VI element, or an n-type impurity. Examples of the Group II elements include zinc, magnesium, cadmium, mercury, manganese and beryllium, examples of the Group VI elements include selenium, zinc sulfide (ZnS) and tellurium, and examples of the n-type impurities include zinc chloride ($ZnCl_2$). A shutter 33 is provided near each particle beam cell 32. The shutter 33 is connected to a control unit not shown in the drawing to open and close the shutter 33.

The deposition chamber 30 is further provided with a plasma generating chamber 34 which irradiates nitrogen plasma towards the substrate 1. The plasma generating chamber 34 consists of, for example, an electron cyclotron resonance (ECR) cell. A microwave terminal 34b in the ECR cell supplies microwaves into the cell surrounded with magnets 34a to generate nitrogen plasma from gaseous nitrogen supplied through a gas inlet pipe 34c. The nitrogen plasma is irradiated from a plasma emitting port 34d. A shutter 33 is provided near the plasma emitting port 34d connected to a control unit not shown in the drawing.

In the production of a luminescent semiconductor device in accordance with this embodiment of the present invention using such a MBE crystal deposition system, the substrate 1 is fixed onto the substrate holder 21 in the deposition chamber 20, and particle beams are fed towards the substrate 1 to deposit a Group III–V buffer layer 2 composed of silicon-doped n-GaAs.

The substrate 1 is transferred to the deposition chamber 30 through the vacuum transfer chamber 41 and fixed onto the substrate holder 31. Relevant particle beams are fed to deposit a Group II–VI compound semiconductor layer. That is, a Group II–VI buffer layer 3 composed of chlorine-doped n-ZnSe, a first clad layer 4 composed of a chlorine-doped n-ZnMgSSe mixed crystal, a first guide layer 5 composed of a ZnSSe mixed crystal, an antidiffusion layer 6 composed of a ZnMgSSe mixed crystal, an active layer 7 composed of a ZnCdSe mixed crystal, an antidiffusion layer 8 composed of a ZnMgSSe mixed crystal, a second guide layer 9 composed of a ZnSSe mixed crystal, a second clad layer 10 composed of a nitrogen-doped p-ZnMgSSe mixed crystal, a first semiconductor layer 11 composed of a nitrogen-doped p-ZnSSe mixed crystal, a second semiconductor layer 12 composed of nitrogen-doped p-ZnSe, a superlattice semiconductor layer 13 composed of nitrogen-doped p-ZnTe and nitrogen doped p-ZnSe, and a contact layer 14 composed of nitrogen doped p-ZnTe are deposited in that order.

After the deposition of the Group II–VI compound semiconductor layer, a resist is applied onto the contact layer 13 and a stripe mask pattern (not show in the drawing) is formed by a lithographic process, and the contact layer 14, the superlattice semiconductor layer 13 and the second semiconductor layer 12 are selectively etched by dry etching through the stripe mask pattern. Alumina is deposited on the etched portions on the first semiconductor layer 11, and the mask pattern is removed together with alumina deposited on the mask pattern to form the insulating layer 15 (referred to as a lift-off process).

Palladium, platinum and gold are deposited on the insulating layer 15 and the contact layer 14, in that order to form a p-side electrode 16. Indium is deposited on the rear face of the substrate 1 to form an n-side electrode 17. A luminescent semiconductor device having a configuration shown in FIG. 3 is fabricated in such a manner.

The resulting luminescent semiconductor device functions as follows. A given voltage is applied between the n-side electrode 17 and the p-side electrode 16 to conduct a current flow in the active layer 7. Light is emitted in the active layer 7 by electron-hole recombination. The constituents (particularly cadmium) in the active layer 7 do not diffuse into other layers, because the antidiffusion layers 6 and 8 composed of the Group II–VI compound semiconductor having a high melting point are provided on the both faces of the active layer 7. The constituents (particularly the Group II elements) in the antidiffusion layers 6 and 8 do not diffuse towards the active layer 7. The wavelength of the luminescent light therefore does not shift towards a shorter wavelength even after a long-term current flow.

Figure 1:
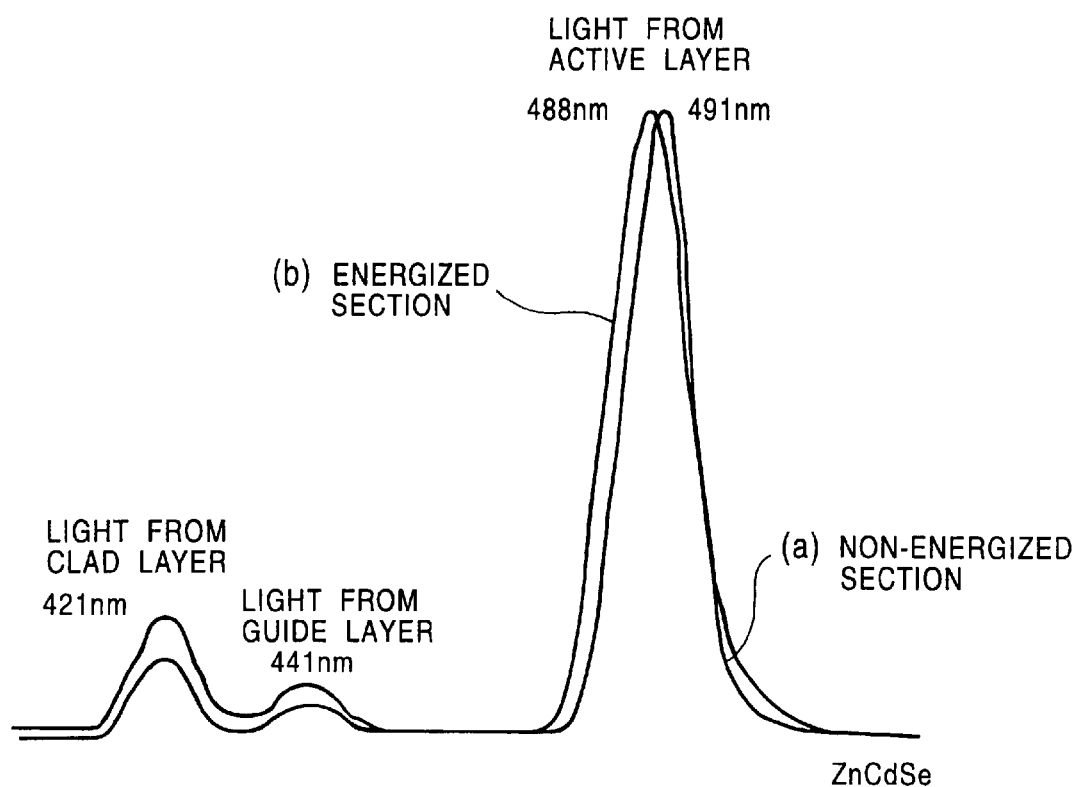
FIG. 1 is a graph including emission spectra obtained by an energizing test of a conventional luminescent semiconductor device.
Figure 2:
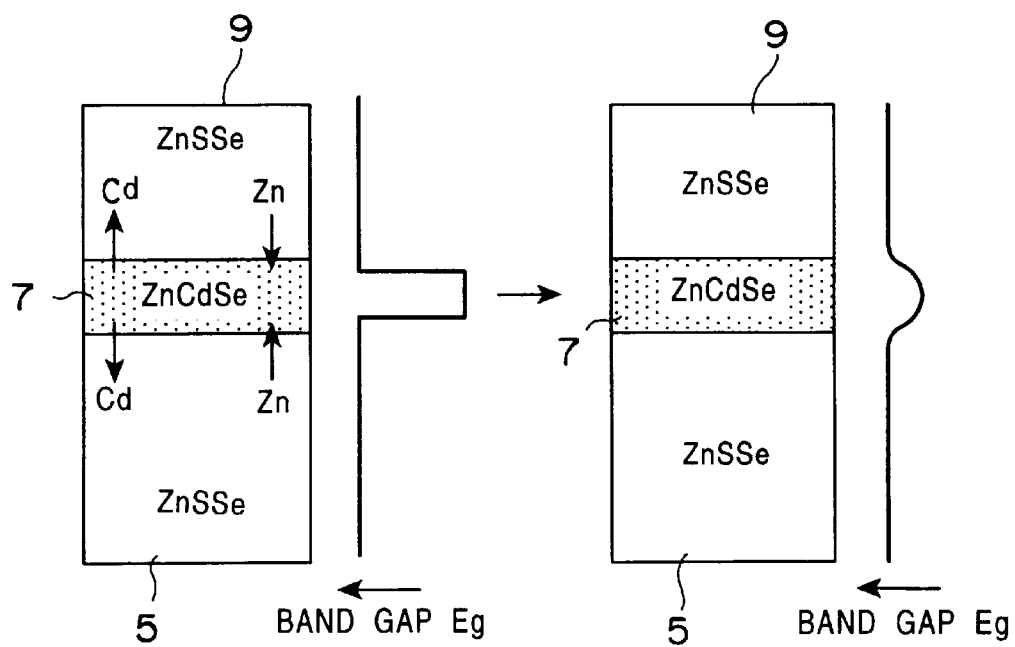
FIG. 2 is a schematic view illustrating diffusion of cadmium in an active layer of a conventional luminescent semiconductor device.
Figure 6:
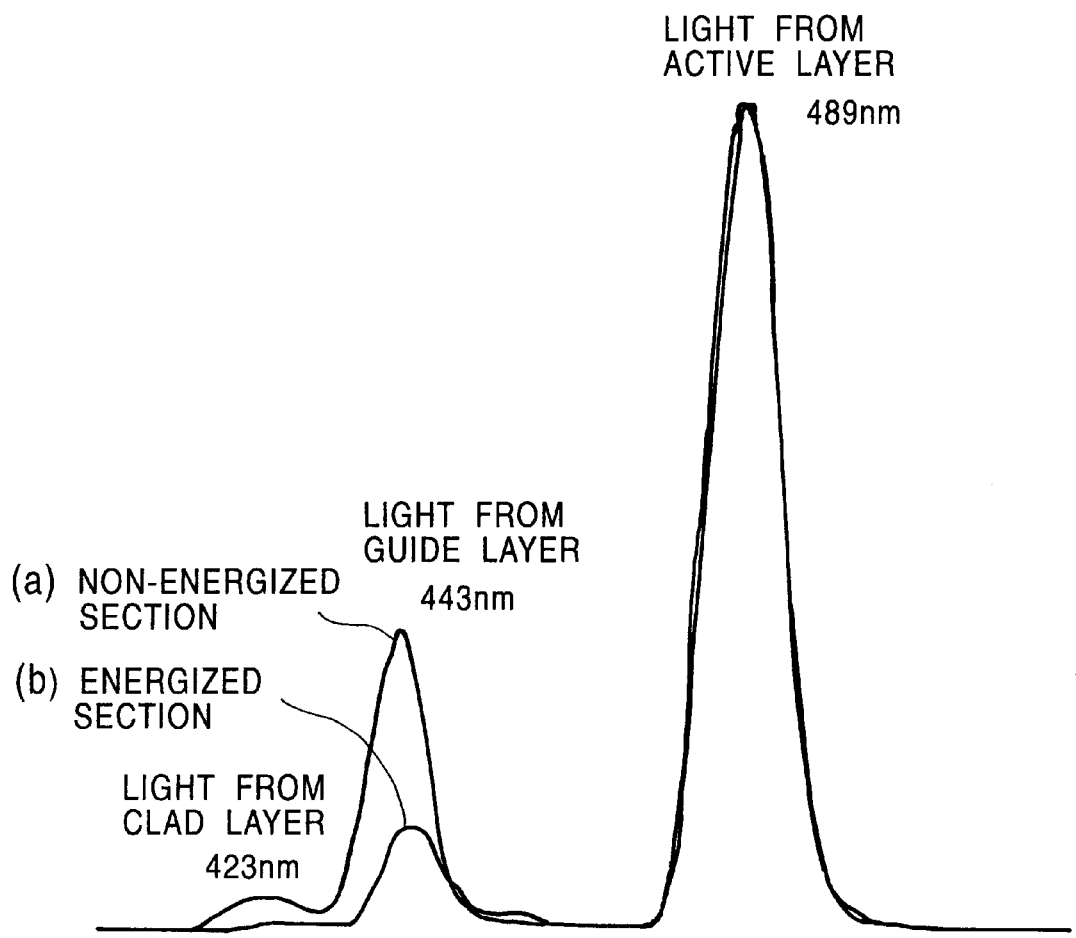
FIG. 6 is a graph including emission spectra obtained by an energizing test of the luminescent semiconductor device shown in FIG. 3.

An energizing test was carried out in order to ensure the advantages of the luminescent semiconductor device in accordance with the present invention. The device was energized at 40° C. for 30 minutes in a 1 mW APC mode, and then all layers above the first semiconductor layer 11 were removed to expose the second clad layer 10. Emission spectra after energizing were measured by a low-temperature cathode luminescence (CL) method. FIG. 6 includes an emission spectrum at an energized section composed of the contact layer etc. and conducting a current flow, and an emission spectrum at a non-energized section composed of the insulating layer 15 and conducting no current flow. The emission spectrum at the non-energized section is equivalent to an emission spectrum before energizing. The emission spectrum from the active layer does not substantially shift by the current flow. The spectra shown in FIG. 6 present a distinct contrast to the spectra shown in FIG. 1.

In the luminescent semiconductor device in accordance with this embodiment, the antidiffusion layers 6 and 8, which are composed of the Group II–VI compound semiconductor having a higher melting point compared to the constitutive ZnCdSe mixed crystal in the active layer 7 and are provided on the both faces of the active layer 7, prevent diffusion of the constituents (particularly cadmium) in the active layer 7, hence the wavelength of the emitted light does not shift to a shorter wavelength. As a result, carrier overflow due to a spread band gap of the active layer 7 is prevented, and an increase in the operating current flow and a decrease in the characteristic temperature are suppressed. Further, the occurrence of DLD is prevented. That is, non-luminescent recombining centers are not increased, resulting in the improvement in the operating current flow and deterioration of the device. In addition, an increase in the half-width of the emission spectrum is prevented, resulting in a decreased gain and an increased operating current flow.

[Second Embodiment]

A luminescent semiconductor device in accordance with a second embodiment of the present invention will now be described. The luminescent semiconductor device in the second embodiment has the same structure as the device in the first embodiment, except that the components in the antidiffusion layers are different from each other. Layers having the same function as in the first embodiment are referred to with the same identification numbers, and a detailed description thereof has been omitted. Also, the antidiffusion layers are referred to with the same identification number and described with reference to FIG. 3, because they are provided for preventing diffusion of the constituents from the active layer 7.

The antidiffusion layers 6 and 8 are composed of a Group II–VI compound semiconductor, that is, a ZnMgSSe mixed crystal. This Group II–VI compound semiconductor has a lattice distortion in the same direction as the direction in the lattice distortion of the Group II–VI compound semiconductor used in the active layer 7, that is, a ZnCdSe mixed crystal. The diffusion of the constituents (particularly cadmium) in the active layer 7 is therefore prevented by the antidiffusion layers 6 and 8, and the diffusion of the constituents (particularly the Group II elements) in the antidiffusion layers 6 and 8 towards the active layer 7 is also prevented. When a layer adjacent to the active layer 7 has a lattice distortion in a different direction from the direction of the lattice distortion in the active layer 7, each constituent diffuses by a current flow so that these distortions moderate each other. In contrast, when the adjacent layer and the active layer 7 have lattice distortions in the same direction, such diffusion is reduced.

When the layer is formed by coherent deposition without rearrangement, the lattice distortion $\epsilon$ of the layer is represented by the following equation (4):

$$\xi = -(a-a_0)/a_0 \qquad (4)$$

wherein $a_0$ is a lattice constant of the substrate 1 and a is a lattice constant of the layer.

When $a > a_0$, the layer has a compressive stress, and when $a < a_0$, the layer has a tensile stress. Since the active layer 7 is composed of a ZnCdSe mixed crystal having a larger lattice constant compared to GaAs in the substrate 1, the active layer 7 has a compressive stress. Lattice constants of crystals are as follows: $a_{ZnSe}=5.6687$ Å, $a_{ZnS}=5.4060$ Å, $a_{CdSe}=6.057$ Å, and $a_{GaAs}=5.654$ Å. The antidiffusion layers 6 and 8 are therefore formed of a Group II–VI compound semiconductor having the same compressive stress as that of the active layer 7, for example, a ZnSSe mixed crystal containing 6% or less of sulfur among the Group VI elements.

Figure 7:
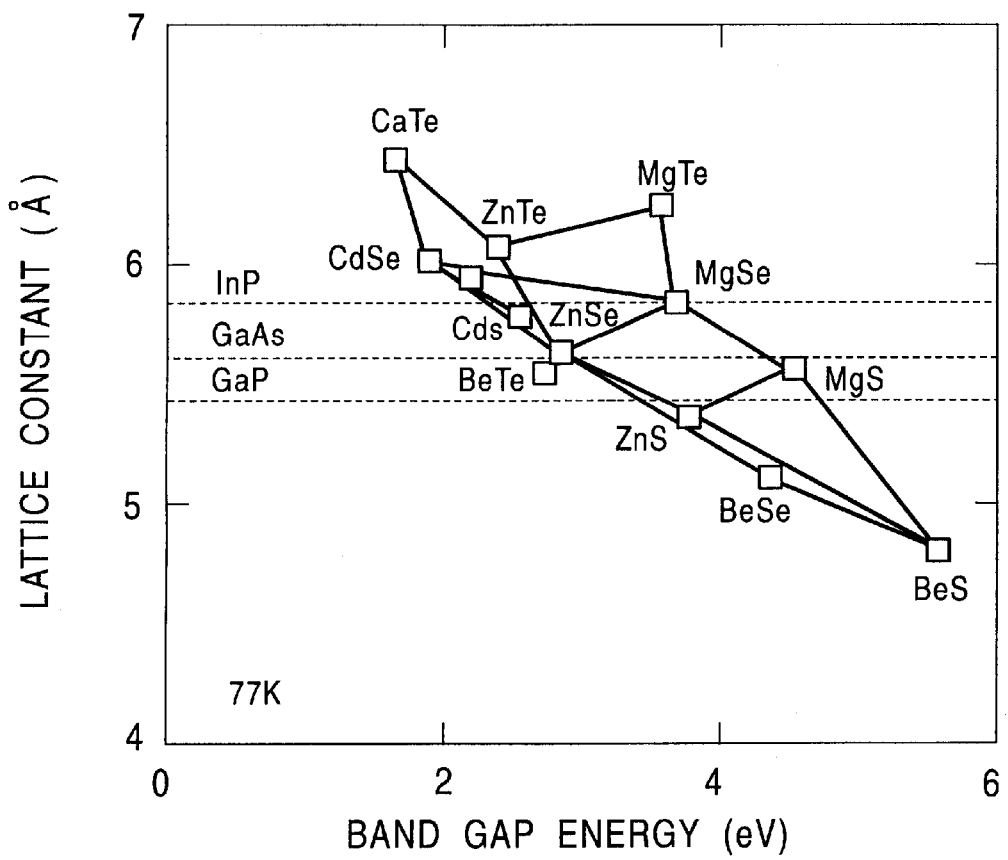
FIG. 7 is a graph illustrating the correlation between the band gap energy and the lattice constant in various Group II–VI compound semiconductors.

FIG. 7 is a graph illustrating the correlation between the band gap energy and the lattice constant in major Group II–VI compound semiconductors. As shown in FIG. 7, Group II–VI compound semiconductors containing magnesium or tellurium may also be employed. Since tellurium belongs to Group VI, it can effectively prevent diffusion of Group VI elements.

The active layer 7 has a compressive stress in the above-mentioned case. Alternatively, when the active layer 7 is composed of a Group II–VI compound semiconductor containing beryllium or the like having a tensile stress, the antidiffusion layers 6 and 8 may also be composed of a Group II–VI compound semiconductor containing beryllium or the like so as to have a tensile stress.

The luminescent semiconductor device having such a configuration can be produced as in the first embodiment, and functions as follows. As shown in FIG. 3, when a given voltage is applied between the n-side electrode 17 and the p-side electrode 16 to conduct a current flow in the active layer 7. Light is emitted in the active layer 7 by electron-hole recombination. The constituents (particularly cadmium) in the active layer 7 do not diffuse into other layers, because the antidiffusion layers 6 and 8 composed of the Group II–VI compound semiconductor having a lattice distortion in the same direction as the lattice distortion in the active layer 7 are provided on the both faces of the active layer 7. The constituents (particularly the Group II elements) in the antidiffusion layers 6 and 8 also do not diffuse towards the active layer 7. The wavelength of the luminescent light therefore does not shift towards a shorter wavelength even after a long-term current flow.

As described above, since the active layer 7 composed of the ZnCdSe mixed crystal and the antidiffusion layers 6 and 8, which are composed of the Group II–VI compound semiconductor and provided on the both faces of the active layer 7, have lattice distortions in the same direction, the constituents (particularly cadmium) do not diffuse from the active layer 7 by a current flow and the wavelength of the luminescent light does not shift towards a shorter wavelength. Accordingly, the second embodiment has the same advantages as the first embodiment.

[Third Embodiment]

A method for making a luminescent semiconductor device in accordance with a third embodiment of the present invention will now be described. This embodiment includes a method for making a luminescent semiconductor device shown in FIG. 8, wherein the luminescent semiconductor device has the same relative arrangement as the device in the first embodiment, except that no antidiffusion layer is provided in the third embodiment. The same identification number is therefore assigned to the same unit.

Using the MBE crystal deposition system shown in FIG. 5, a substrate 1 is fixed onto the substrate holder 21 in the deposition chamber 20, and a Group III–V buffer layer 2 composed of silicon-doped n-GaAs is deposited on the substrate 1 by feeding relevant particle beams. Next, the substrate 1 is transferred to the deposition chamber 30 through the vacuum transfer chamber 41 and fixed onto the substrate holder 31. Group II–VI compound semiconductor layers are separately deposited on the substrate 1 by feeding relevant particle beams, that is, a Group II–VI buffer layer 3 composed of chlorine-doped n-ZnSe, a first clad layer 4 composed of a chlorine-doped n-ZnMgSSe mixed crystal, a first guide layer 5 composed of a ZnSSe mixed crystal, an active layer 7 composed of a ZnCdSe mixed crystal, a second guide layer 9 composed of a ZnSSe mixed crystal, a second clad layer 10 composed of a nitrogen-doped p-ZnMgSSe mixed crystal, a first semiconductor layer 11 composed of a nitrogen-doped p-ZnSSe mixed crystal, a second semiconductor layer 12 composed of nitrogen-doped p-ZnSe, a superlattice semiconductor layer 13 composed of nitrogen-doped p-ZnTe and nitrogen-doped p-ZnSe, and a contact layer 14 composed of nitrogen-doped p-ZnTe are deposited in that order.

When depositing the Group II–VI buffer layer 4, the first and second clad layers 4 and 9, the first and second semiconductor layers 10 and 12, the superlattice semiconductor layer 13 and the contact layer 14, the amount of the Group VI elements to be fed is adjusted to be greater than (1 to 2 times) the amount of the Group II elements to be fed. In contrast, when depositing the first and second guide layers 5 and 9, the amount of the Group VI elements to be fed is adjusted to be greater than (1 to 2 times) the amount of the Group II elements to be fed at the side facing the first clad layer 4 or the clad layer 10, or to be smaller than (preferably 0.9 times or less) the amount of the Group II elements to be fed at the side facing the active layer 7. At the side facing the active layer 7, it is preferable that the amount of the Group VI elements be smaller than that of the Group II elements in a region within 10 nm from the surface of each of the first and second guide layers 5 and 9.

When depositing the active layer 7, the amount of the Group VI elements to be fed is adjusted to be smaller (preferably 0.9 times or less) than the amount of the Group II elements to be fed.

Figure 9:
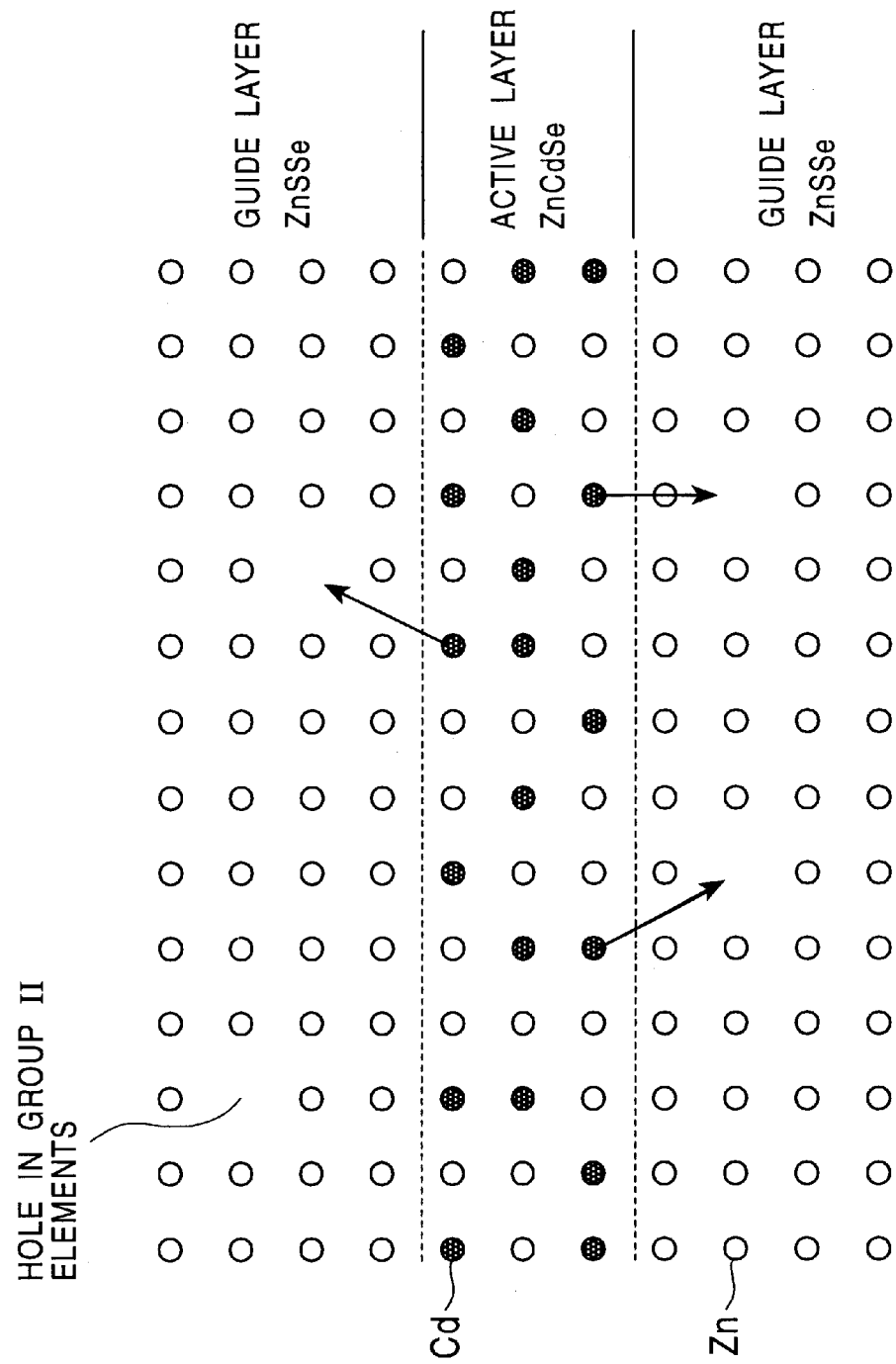
FIG. 9 is a schematic view illustrating diffusion of cadmium in an active layer.

When the amount of the Group VI elements to be fed is smaller than that of the Group II elements to be fed in the deposition of the sides, facing the active layer, of the first and second guide layers 5 and 7, the hole density of the Group II element is decreased in and near the active layer 7, and thus diffusion of the constituents (particularly cadmium) in the active layer 7 into the adjacent layers and of the constituents (particularly Group II elements) in the adjacent layers into the active layer 7 is prevented. As shown in FIG. 9, when the hole density in the Group II element layer is high, cadmium, a Group II element, in the active layer readily diffuses towards the hole.

The hole density in the Group II element layer depends on the mole ratio of the fed Group VI elements to the fed Group II elements (VI/II ratio), hence the hole density in the Group II element layer decreases when the amount of the fed Group II elements is larger than that of the fed Group VI elements.

Figure 8:
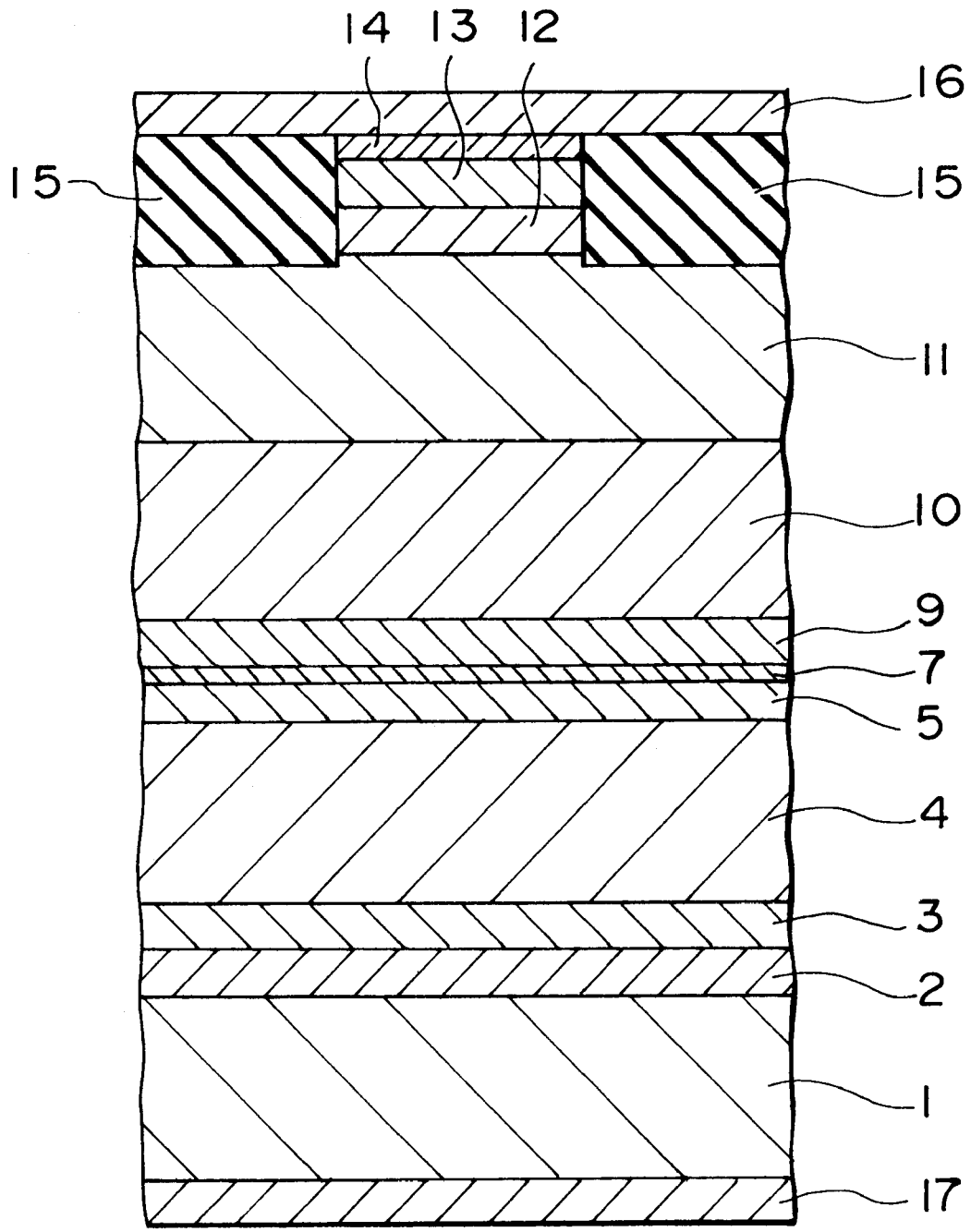
FIG. 8 is a cross-sectional view of a luminescent semiconductor device produce by a method in accordance with a third embodiment of the present invention.

After depositing these II–VI compound semiconductor layers, the contact layer 14, the superlattice semiconductor layer and the second semiconductor layer 12 are selectively removed to form a stripe, and an insulating layer 15 is formed on the removed region. Next, palladium, platinum and gold are deposited on the insulating layer 15 and the contact layer 14 in that order to form a p-side electrode 16. Indium is deposited on the rear face of the substrate 1 to form an n-side electrode 17. A luminescent semiconductor deice shown in FIG. 8 is formed in such a manner.

The resulting luminescent semiconductor device functions as follows. A given voltage is applied between the n-side electrode 17 and the p-side electrode 16 to conduct a current flow in the active layer 7. Light is emitted in the active layer 7 by electron-hole recombination. Since the hole density of the Group II elements is decreased in and near the active layer 7, the constituents (particularly cadmium) in the active layer 7 do not diffuse into other layers. The constituents (particularly the Group II elements) in the adjacent first and second guide layers 5 and 9 also do not diffuse towards the active layer 7. The wavelength of the luminescent light therefore does not shift towards a shorter wavelength even after a long-term current flow.

Figure 10:
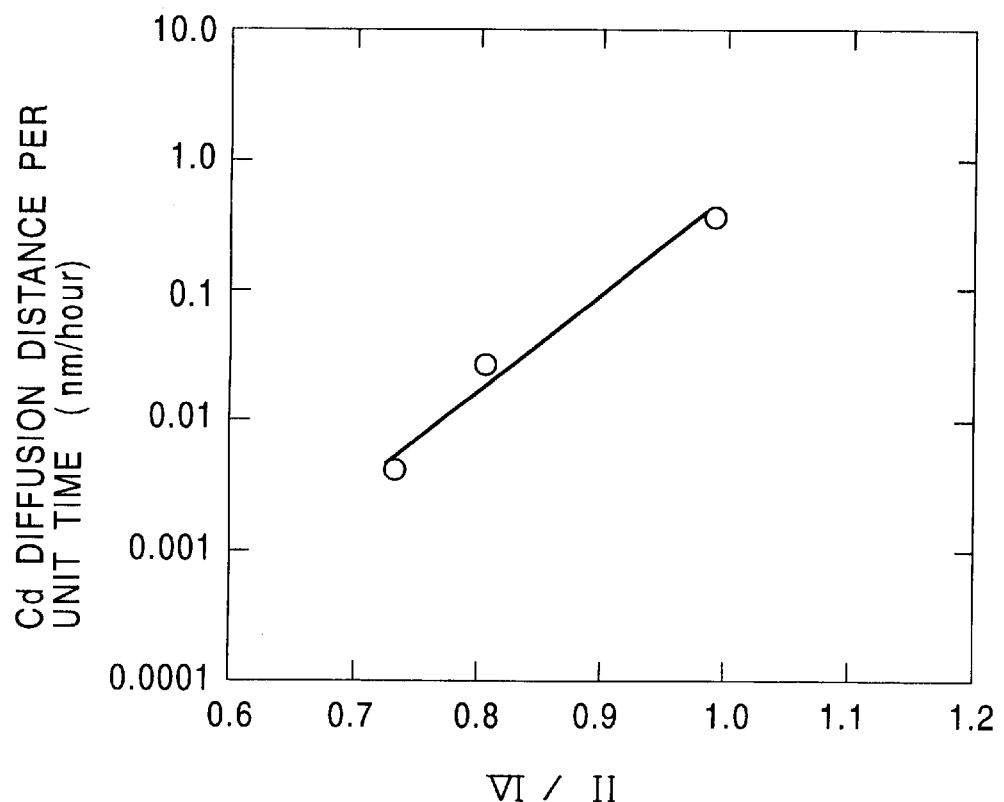
FIG. 10 is a graph illustrating the correlation between the dose ratio of the particle beam of Group VI elements to the particle beam of Group II elements and diffusion distance of cadmium.

In order to ensure the advantages of the method for making the luminescent semiconductor device in accordance with this embodiment, a correlation between the diffusion distance of cadmium per unit time and the mole ratio of the fed Group VI elements to the fed Group II elements (VI/II ratio) in the first and second guide layers 5 and 9 was studied. The results are shown in FIG. 10. The diffusion distance of cadmium was determined based on the shift of the wavelength of the luminescent light from the active layer 7 before and after energizing, and indicates an average distance of cadmium from the interface between the active layer 7 and the first guide layer 5 or second guide layer 9 to the first guide layer 5 or the second guide layer 9. As shown in FIG. 10, the diffusion distance of cadmium depends on the mole ratio of the fed Group VI elements to the fed Group II elements (VI/II ratio), in other words, it decreases when the VI/II ratio decreases. When the VI/II ratio is 0.9 or less, the diffusion distance can be suppressed to 0.1 nm/hour and thus the advantages in this embodiment can be effectively achieved.

In the luminescent semiconductor device in accordance with this embodiment, the active layer 7 and its neighborhood are deposited while the amount of the Group VI elements to be fed to the amount of the Group II element to be fed is decreased, hence the constituents (particularly cadmium) do not diffuse from the active layer 7. As a result, the wavelength of the luminescent light therefore does not shift towards a shorter wavelength even after a long-term current flow. Accordingly, this embodiment has the excellent advantages as in the first embodiment.

[Fourth Embodiment]

Figure 11:
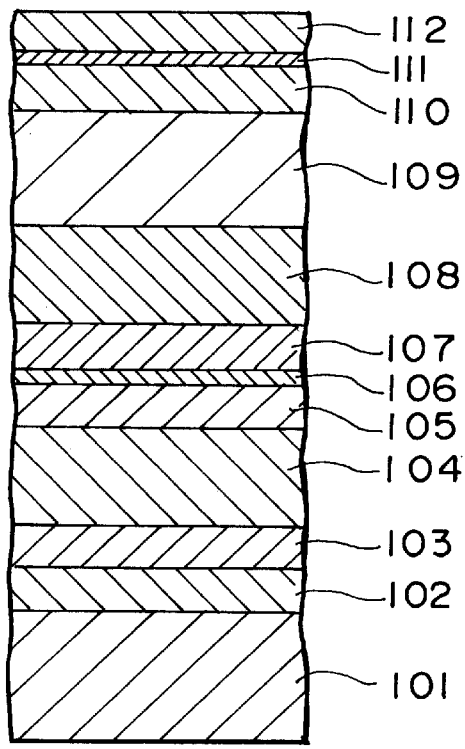
FIG. 11 is a cross-sectional view of a luminescent semiconductor device in accordance with a fourth embodiment of the present invention.

A luminescent semiconductor device in accordance with a fourth embodiment of the present invention will now be described. FIG. 11 is a schematic cross-sectional view of the luminescent semiconductor device, in which a first buffer layer 102, a second buffer layer 103, a first clad layer 104, a first guide layer 105, an active layer 106, a second guide layer 107, a second clad layer 108, a first electrode layer 109, a second electrode layer 110, a superlattice electrode layer 111 and a third electrode layer 112 are deposited in that order on a substrate 101.

The substrate 101 is composed of, for example, n-GaAs containing silicon as an n-type impurity and having a thickness of 300 $\mu$m. The first buffer layer 102 is composed of, for example, n-GaAs containing silicon as an n-type impurity and having a thickness of 300 $\mu$m. The second buffer layer 103 is composed of, for example, n-ZnSe containing chlorine as an n-type impurity and having a thickness of 30 $\mu$m. The concentration of the impurity in this layer is, for example, $1\times10^{18}\text{cm}^{-3}$. The first clad layer 104 is composed of, for example, a n-ZnMgSSe mixed crystal containing chlorine as an n-type impurity and having a thickness of 1 $\mu$m. The concentration of the impurity in this layer is, for example, $3\times10^{17}\text{cm}^{-3}$. The first guide layer 105 is composed of, for example, a n-ZnSSe mixed crystal containing chlorine as an n-type impurity or an undoped ZnSSe mixed crystal and having a thickness of 100 $\mu$m. When doping the impurity, the concentration of the impurity in this layer is, for example, $1\times10^{17}\text{cm}^{-3}$. The constituents in the first clad layer 104 and the first guide layer 105 are adjusted such that the lattice constant of these layers is the same as the lattice constant of the substrate 101, that is, the lattice constant of GaAs. For example, the first guide layer 105 is composed of 6% sulfur and 94% selenium as Group VI elements.

The active layer 106 is composed of, for example, a ZnCdSe mixed crystal having a thickness of 2 to 10 nm. The Group II elements are composed of 80 to 60% of zinc and 20 to 40% of cadmium, and the mixed crystal has 1.5 to 3.0% of lattice dislocation to the substrate 101. The second guide layer 107 is composed of, for example, a nitrogen-doped or undoped ZnSSe mixed crystal having a thickness of 100 nm. When doping the impurity, the concentration of the impurity in this layer is, for example, $5\times10^{17}\text{cm}^{-3}$. The second clad layer 108 is composed of, for example, a nitrogen-doped p-ZnMgSSe mixed crystal having a thickness of 1 $\mu$m. The concentration of the impurity in this layer is, for example, $3\times10^{17}\text{cm}^{-3}$. The ratio of the added impurity in the second clad layer 108 is approximately 50%. The constituents in the second guide layer 107 and the second clad layer 108 are adjusted such that the lattice constant of these layers are the same as the lattice constant of the substrate 101, that is, lattice constant of GaAs. For example, the second guide layer 107 is composed of 6% sulfur and 94% selenium as Group VI elements.

The first electrode layer 109 is composed of, for example, a p-ZnSSe mixed crystal containing nitrogen as a p-type impurity and having a thickness of 500 nm. The concentration of the impurity in this layer is, for example, $5\times10^{17}\text{cm}^{-3}$. The second electrode layer 110 is composed of, for example, p-ZnSe containing nitrogen as a p-type impurity and having a thickness of 100 nm. The concentration of the impurity in this layer is, for example, $1\times10^{18}\text{cm}^{-3}$. The superlattice electrode layer 111 is composed of, for example, a superlattice layer consisting of alternately overlaid nitrogen-doped p-ZnTe and nitrogen-doped p-ZnSe. The third electrode layer 112 is composed of, for example, p-ZnTe containing nitrogen as a p-type impurity. The concentration of the impurity in this layer is, for example, $1\times10^{19}\text{cm}^{-3}$.

Figure 12:
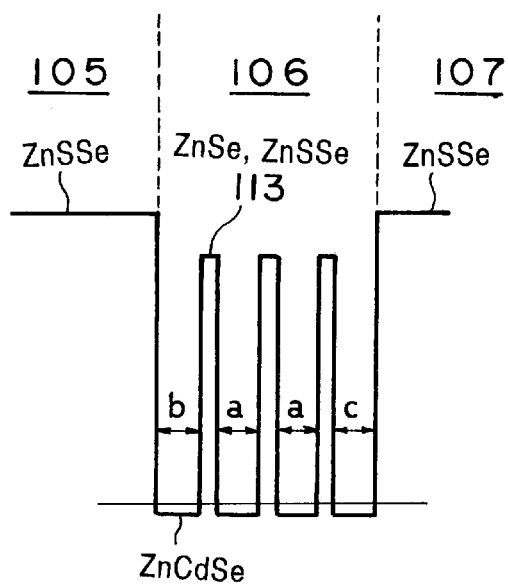
FIG. 12 is a schematic view of an energy state in the conductive band for illustrating the structure of an active layer of the luminescent semiconductor device shown in FIG. 11.

In the luminescent semiconductor device, as shown by a conductive band in FIG. 12, the active layer 106 includes a plurality of lattice-dislocated layers 113 having a lattice constant smaller than that in the active layer 106, so that the movement of holes or point defects in the active layer 106 perpendicular to the substrate 101 is suppressed. These lattice-dislocated layers 113 are composed of ZnSe or a ZnSSe mixed crystal. A higher sulfur ratio increases the lattice constant and thus the difference in the lattice constant between the lattice-dislocated layer 113 and the active layer 106, hence the movement of the point defects can be more effectively suppressed. A large difference in the lattice constant, however, will form novel defects, hence such a difference in the lattice constant is preferably within 10% or less.

It is preferable that each lattice-dislocated layer 113 be as thick as possible in order to effectively suppress the movement of the point defects. An excessive thickness, however, reduces the trapping effect of electrons in the active layer 106, resulting in shortening of the luminescent light, as well as an increasing threshold current flow. It is therefore preferable that the thickness be 10 atomic layers (approximately 3 nm) or less so as to spread the wave equation of electrons to the adjacent active layer 106. The thickness is more preferably 3 atomic layers or less. The luminescent light can be appropriately determined by increasing the cadmium content in the active layer 106 or by changing the structure of the lattice-dislocated layers 113.

The total thickness of the lattice-dislocated layers 113 is within the critical thickness of the active layer 106 so as not to form new defects. A distance a between two adjacent lattice-dislocated layers 113, a distance b between the first guide layer 105 and the nearest lattice-dislocated layer 113, and a distance c between the second guide layer 107 and the nearest lattice-dislocated layer 113 are within 10 atomic layers or less, in other words, thicknesses a, b and c in the active layer 106 are 10 atomic layers or less, in order to suppress the movement of point defects in the active layer 106.

The luminescent semiconductor device having such a configuration is produced with the MBE crystal deposition system shown in FIG. 5. A substrate 101 is fixed onto the substrate holder 21 in the deposition chamber 20, and heated to approximately 580° C. to remove the surface oxide film on the substrate 1. Next, relevant particle beams are fed to deposit a first buffer layer 102 composed of silicon-doped n-GaAs. The substrate 101 is transferred to the deposition chamber 30 through the vacuum transfer chamber 41, and fixed onto the substrate holder 31.

While the substrate 101 is heated to approximately 300° C., the relevant particle beams are fed to separately deposit a second buffer layer 103 composed of chlorine-doped n-ZnSe, a first clad layer 104 composed of chlorine-doped n-ZnMGSSe, and a first guide layer 105 composed of chlorine-doped n-ZnSSe in that order.

After a part of an active layer 106 composed of ZnCdSe is deposited, a lattice-dislocated layer 113 composed of ZnSe or ZnSSe is deposited thereon. After another part of the active layer 106 is deposited, a lattice-dislocated layer 113 is deposited thereon. Such a procedure is repeated several times to form the active layer 106 provided with a plurality of lattice-dislocated layers 113. In the deposition of the active layer 106, zinc and cadmium as Group II elements, and selenium as a Group VI element are alternately fed. Also, in the deposition of each lattice-dislocated layer 112, zinc as a Group II element, and at least one element of sulfur and selenium as Group VI elements are alternately fed.

Next, a guide layer 107 composed of nitrogen-doped p-ZnSSe, a clad layer 108 composed of nitrogen-doped p-ZnMgSSe, a first electrode layer 109 composed of a nitrogen-doped p-ZnSSe, a second electrode layer 110 composed of a nitrogen-doped p-ZnSe, a superlattice electrode layer 111 composed of nitrogen-doped p-ZnTe and nitrogen-doped p-ZnSe, and a third electrode layer 112 composed of nitrogen-doped p-ZnTe are deposited in that order. The luminescent semiconductor device shown in FIG. 11 is formed in such a manner.

Figure 13:
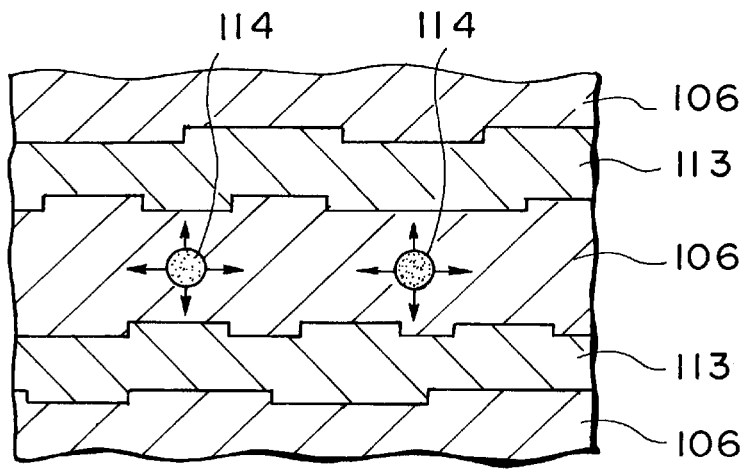
FIG. 13 is a schematic cross-sectional view for illustrating the movement of point defects in the active layer of the luminescent semiconductor device shown in FIG. 11.

The resulting luminescent semiconductor device functions as follows. A given voltage is applied between the substrate 101 and the third electrode layer 112 to conduct a current flow in the active layer 106 through the third electrode layer 112, the superlattice electrode layer 111, the second electrode layer 110, the first electrode layer 109, the second clad layer 108 and the second guide layer 107. Light is emitted in the active layer 106 by electron-hole recombination. Since hole-type point defects 114 due to lattice disorder with the substrate 101 are present, as shown in FIG. 13, non-luminescent recombination of electrons which do not contribute to luminescence with holes occurs. Further, point defects 114 move and gather to form a larger defect. Since a plurality of lattice-dislocated layers 113 having a smaller lattice constant compared to the active layer 106 are intervened in the active layer 106, point defects 114 do not migrate into the lattice-dislocated layers 113 but are trapped in the active layer 106 having a lower energy. The movement of point defects 114 perpendicular to the substrate 101 is suppressed.

Since the interface between the active layer 106 and each lattice-dislocated layer 113 is not planarized and has unevenness of an atomic layer level, perturbation of energy in the crystal lattice occurs. The movement of the point defects 114 in the active layer 106 in the direction parallel to the substrate 101 is also suppressed.

As described above, since lattice-dislocated layers 113 having a smaller lattice constant than the active layer 106 are intervened in the active layer 106, the movement of the point defects 114 in the active layer 106 in the direction perpendicular to the substrate 101 can be suppressed. Coagulation of and increase in the point defects 114 can therefore be prevented, and an increase in non-luminescent recombination centers can be prevented. As a result, the life of the luminescent semiconductor device can be prolonged.

The distance between two adjacent lattice-dislocated layers 113 and the distance between the first guide layer 105 or the second guide layer 17 and its nearest lattice-dislocated layer 113 are controlled to be 10 atomic layers or less, hence the movement of the point defects 114 in the thin films in the active layer 106 can be suppressed.

Since the thickness of each lattice-dislocated layer 113 is controlled to be 10 atomic layers or less, and preferably 3 atomic layers or less, the movement of the point defects 114 can be effectively suppressed without increasing the threshold current. In addition, the fluctuation in the lattice constant of the active layer 106 is controlled to be 10% or less, and the total thickness of the lattice-dislocated layers 113 is set to be smaller than the critical thickness to the lattice constant of the active layer 106, hence the movement of the point defects 114 can be effectively suppressed without the formation of new defects.

In accordance with the method for making the luminescent semiconductor device of this embodiment, each active layer portion 6 and each lattice-dislocated layer 13 are deposited by alternately feeding Group II elements and Group VI elements, hence the active layer 6 and the lattice-dislocated layer 13 can be controlled at atomic levels, and these thin layers can be formed with high accuracy.

[Fifth Embodiment]

Figure 14:
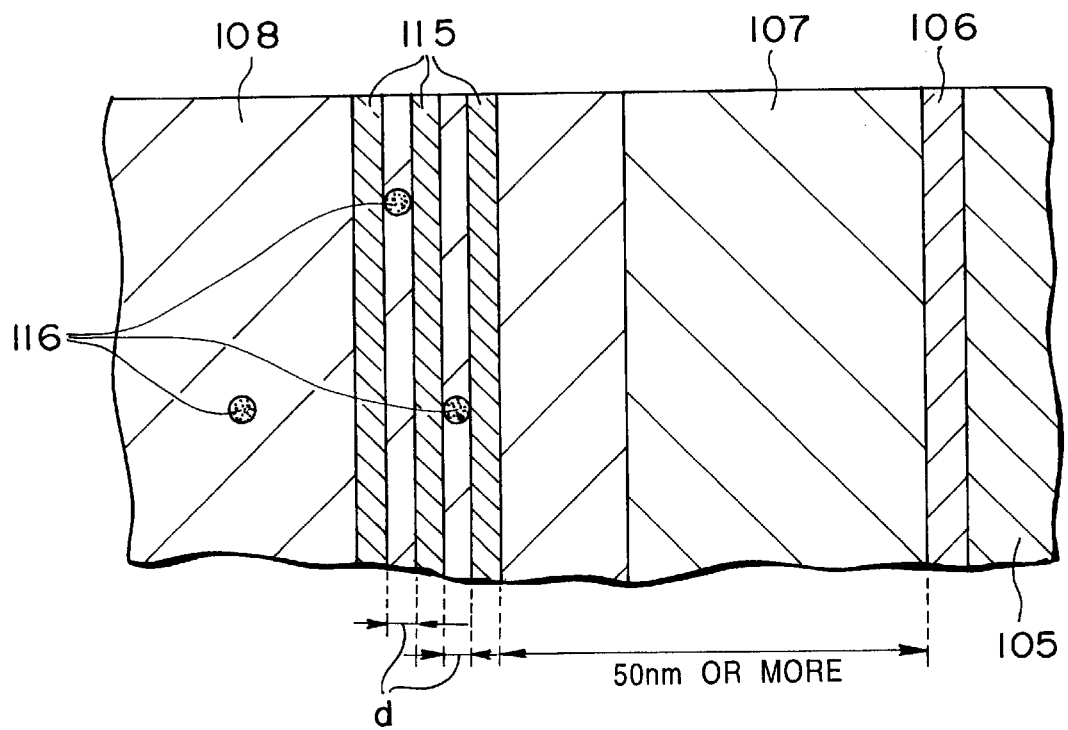
FIG. 14 is a partial cross-sectional view of a second clad layer in accordance with a fifth embodiment of the present invention.

FIG. 14 is a partial cross-sectional view near a second clad layer 8 of a luminescent semiconductor device in accordance with a fifth embodiment of the present invention. The luminescent semiconductor device in this embodiment has substantially the same configuration as that in the fourth embodiment, but lattice-dislocated layers 115 are provided in the second clad layer 118 instead of in the active layer 106 in the fourth embodiment. The same identification number is therefore allocated to the same layer, and the detailed description is omitted.

A plurality of lattice-dislocated layers 115 are intervened in the second clad layer 108 near the interface with the second guide layer 107. Each lattice-dislocated layer 115 has a lattice constant larger than that of the second clad layer 108 to inhibit the movement of inter-lattice-type point defects 116 in the second clad layer 108 towards the active layer 106. Since an excessively large difference in the lattice constant between the lattice-dislocated layer 115 and the second clad layer 108 causes the occurrence of new defects, it is preferable that the difference be 10% or less. Although a thicker lattice-dislocated layer 115 is desired for effective control of the movement of the point defects 116, an excessively thicker lattice-dislocated layer 115 will also cause the occurrence of new defects, hence the total thickness of the lattice-dislocated layers 115 must be within the critical thickness of the second clad layer 108. When the thickness of each lattice-dislocated layer 115 is increased, it is preferred that the difference in the lattice constant between the lattice-dislocated layer 115 and the second clad layer 108 be 5% or less.

Preferably, the distance d between two adjacent lattice-dislocated layers 115 is 10 nm or less. Point defects 116 passing through the first lattice-dislocated layer 115 are blocked by the second lattice-dislocated layer 115, and thus are trapped in the second clad layer 108 between these two lattice-dislocated layers 115. Further, these lattice-dislocated layers 115 prevent coagulation of the point defects 116 caused by the movement in the second clad layer 108. The nearest lattice-dislocated layer 115 lies at a position at least 50 nm distant from the active layer 106, so that point defects 116, which are blocked by and lie near the lattice-dislocated layers 115, are not excited and activated by the light emitted from the activated layer 106.

Each lattice-dislocated layer 115 is composed of a p-ZnCdSe, p-ZnMgSe, or p-ZnMgCdSe mixed crystal which are doped with nitrogen as a p-type impurity. Preferably, the lattice-dislocated layer 115 is composed of a p-ZnMgCdSe mixed crystal, because the band structure in the second clad layer 108 slightly changes by the intervention of the lattice-dislocated layers 115 and the movement of the point defects 116 can be suppressed without inhibiting injection of holes into the active layer 106.

The luminescent semiconductor device having such a configuration is produced as in the fourth embodiment. Although both the active layer 106 and each lattice-dislocated layer 113 are deposited by alternately feeding Group II elements and Group VI elements in the fourth embodiment, only each lattice-dislocated layer 115 is deposited by alternately feeding Group II elements and Group VI elements in this embodiment.

The resulting luminescent semiconductor device functions as follows. When a given voltage is applied between the substrate 101 and the third electrode layer 112, light is emitted in the active layer 106 by electron-hole recombination, as in the fourth embodiment. Point defects 116 in the second clad layer 108 are activated by the light from the active layer 106 and move towards the active layer 106. These point defects 116, however, are trapped in the second clad layer 108 rather than enter the lattice-dislocated layers 115, because these lattice-dislocated layers 115 have a larger lattice constant than that of the second clad layer 108. The point defects 116 therefore do not reach near the active layer 106 by blocking effects of the lattice-dislocated layers 115. If some point defects 116 pass through a lattice-dislocated layer 115, these will be blocked by the next lattice-dislocated layer 115. Further, the movement of the point defects 116 trapped between these two lattice-dislocated layers 115 is also constrained because of a small thickness of the second clad layer 108 between the two lattice-dislocated layers 115.

In accordance with the luminescent semiconductor device in this embodiment, as described above, lattice-dislocated layers 115 having a larger lattice constant than that of the second clad layer 108 are intervened in the second clad layer 108. The movement of the point defects 116 in the second clad layer 108 towards the active layer 106 is suppressed by the lattice-dislocated layers 115. Coagulation of the point defects 116 near the active layer 106 and thus the formation of a black point can therefore be prevented. As a result, the life of the active layer 106, that is, the life of the luminescent semiconductor device can be prolonged.

By providing a plurality of lattice-dislocated layers 115, a point defect 116 passing through any one of the lattice-dislocated layers 115 is blocked by the next lattice-dislocated layer 115. The movement of the point defects 116 towards the active layer 106 therefore can be more effectively suppressed. Further, a narrow distance d, that is, 10 nm or less, between two adjacent lattice-dislocated layers 115 can prevent the movement and coagulation of the point defects 116 trapped in the second clad layer 108 between the two adjacent lattice-dislocated layers 115.

In addition, the nearest lattice-dislocated layer 115 is at least 50 nm distant from the active layer 106, hence the point defects 116 trapped by the lattice-dislocated layer 115 are barely activated by the light from the active layer 106 or by the non-luminescent recombination of electrons with holes overflowing the active layer 106. That is, such a configuration of the lattice-dislocated layers 115 prevents light absorption or extension as a dark line into the active layer 106 of the point defects 116 trapped near the lattice-dislocated layers 115.

By controlling the difference in the lattice constant between the second clad layer 108 and the lattice-dislocated layer 115 to 10% or less, and the total thickness of the lattice-dislocated layers 115 to be lower than the critical thickness for the lattice constant of the second clad layer 108, the movement of the point defects 116 can be effectively suppressed without the formation of new defects.

[Sixth Embodiment]

Figure 15:
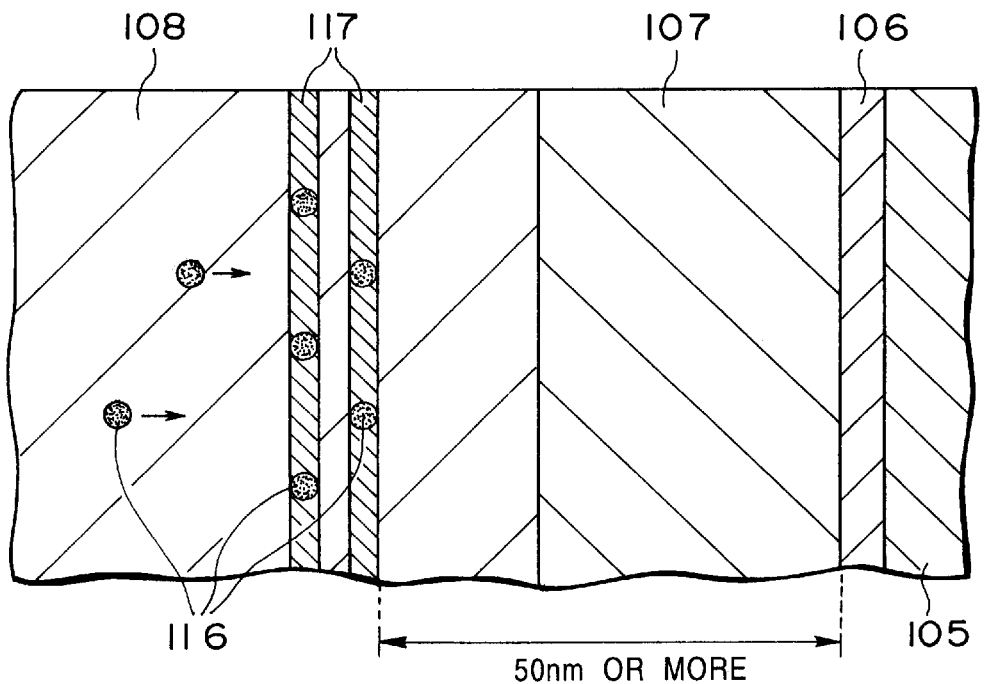
FIG. 15 is a partial cross-sectional view of a second clad layer in accordance with a sixth embodiment of the present invention.

FIG. 15 is a partial cross-sectional view near a second clad layer 108 of a luminescent semiconductor device in accordance with a sixth embodiment of the present invention. In this embodiment, a plurality of different-type lattice-dislocated layers 117 instead of the lattice-dislocated layers 117 in the fourth embodiment are intervened in the second clad layer 108. These lattice-dislocated layers 117 are intervened in the second clad layer 108 near the interface with the guide layer 107. Each lattice-dislocated layer 117 has a smaller lattice constant than that of the second clad layer 108 to trap inter-lattice-type point defects 116 in the second clad layer 108 and thus to suppress the movement of the point defects 116 towards the active layer 106. An excessively great difference in the lattice constant between the lattice-dislocated layer 117 and the second clad layer 108 causes the formation of new defects, hence it is preferable that the difference be 10% or less.

The thickness of each lattice-dislocated layers 117 is preferably 10 nm or less, and more preferably 10 atomic layers or less in order to constrain the movement and coagulation of point defects 116 trapped in the lattice-dislocated layer 117. The total thickness of the lattice-dislocated layers 117 must be within the critical thickness of the second clad layer 108 so as not to form new defects.

The lattice-dislocated layers 117 are at least 50 nm distant from the active layer 106 so that the point defects trapped in the lattice-dislocated layers 117 are not excited and activated by the light emitted from the active layer 106. Each lattice-dislocated layer 117 is composed of a p-ZnCdSe, p-ZnSSe, or p-ZnBeSe mixed crystal which are doped with nitrogen as a p-type impurity. In the p-ZnSSe mixed crystal, the sulfur content in the Group VI elements is 6% or more.

The luminescent semiconductor device having such a configuration is produced as in the fifth embodiment. Each lattice-dislocated layer 117 is deposited by alternately feeding Group II elements and Group VI elements in this embodiment.

The resulting luminescent semiconductor device functions as follows. When a given voltage is applied between the substrate 101 and the third electrode layer 112, light is emitted by electron-hole recombination in the active layer 106, as in the fourth embodiment. Point defects 116 in the second clad layer 108 are activated by the light from the active layer 106 and move towards the active layer 106. These point defects 116, however, are trapped in the lattice-dislocated layers 117, because these lattice-dislocated layers 117 have a smaller lattice constant than that of the second clad layer 108. The point defects 116 therefore do not reach near the active layer 106 by blocking effects of the lattice-dislocated layers 117. If some point defects pass through a lattice-dislocated layer 117, these will be blocked by the next lattice-dislocated layer 117. Further, the movement of the point defects 116 trapped between these two lattice-dislocated layers 117 is also constrained because of a small thickness of the second clad layer 108 between the two lattice-dislocated layers 117.

In accordance with the luminescent semiconductor device in this embodiment, as described above, lattice-dislocated layers 117 having a smaller lattice constant than that of the second clad layer 108 are intervened in the second clad layer 108. The movement of the point defects 116 in the second clad layer 108 towards the active layer 106 is suppressed by the lattice-dislocated layers 117. Coagulation of the point defects 116 near the active layer 106 and thus the formation of a black point can be prevented. As a result, the life of the active layer 106, that is, the life of the luminescent semiconductor device can be prolonged.

By providing a plurality of lattice-dislocated layers 117, a point defect 116 passing through any one of the lattice-dislocated layers 117 is blocked by the next lattice-dislocated layer 117. The movement of the point defects 116 towards the active layer 106 therefore can be more effectively suppressed. Further, since the narrow distance between two adjacent lattice-dislocated layers 117 is controlled to 10 nm or less and preferably 10 atomic layers or less, the movement and coagulation of the point defects 116 trapped in the second clad layer 108 between the two adjacent lattice-dislocated layer 117 is prevented.

In addition, the lattice-dislocated layers 117 are at least 50 nm distant from the active layer 106, hence the point defects 116 trapped by the lattice-dislocated layer 117 are barely activated by the light from the active layer 106 or by the non-luminescent recombination of electrons with holes overflowing the active layer 106. That is, such a configuration of the lattice-dislocated layer 117 prevents light absorption or extension as a dark line into the active layer 106 of the point defects 116 trapped near the lattice-dislocated layer 117.

By controlling the difference in the lattice constant between the second clad layer 108 and the lattice-dislocated layer 117 to 10% or less, and the total thickness of the lattice-dislocated layers 117 to be lower than the critical thickness for the lattice constant of the second clad layer 108, the movement of the point defects 116 can be effectively suppressed without the formation of new defects.

[Seventh Embodiment]

Figure 16:
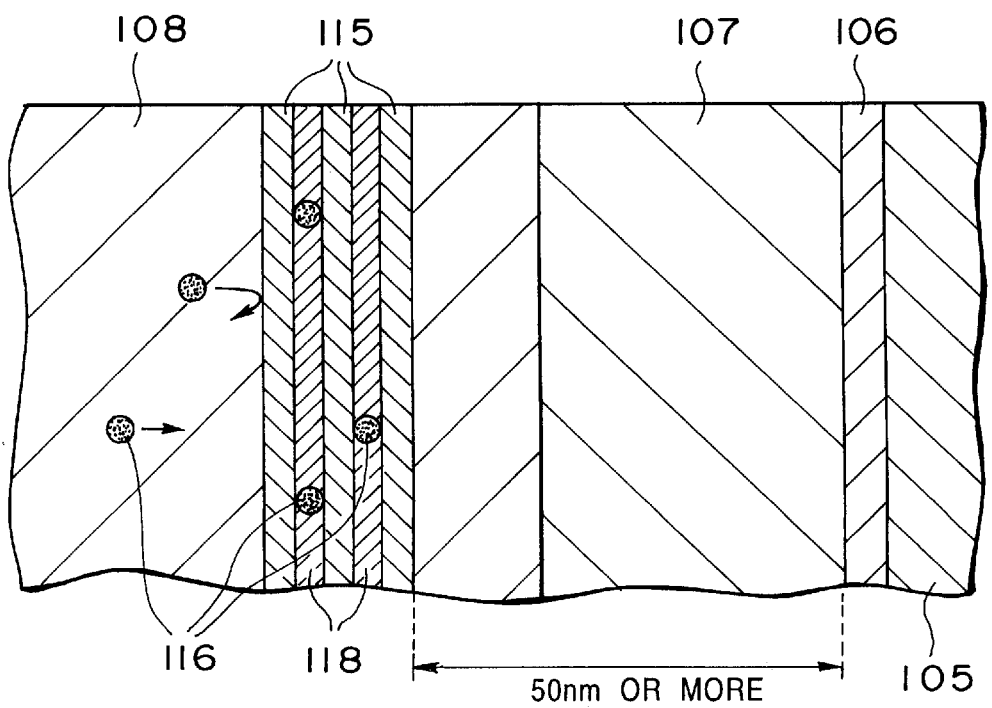
FIG. 16 is a partial cross-sectional view of a second clad layer in accordance with a seventh embodiment of the present invention.

FIG. 16 is a partial cross-sectional view near a second clad layer 108 of a luminescent semiconductor device in accordance with a seventh embodiment of the present invention. In this embodiment, a plurality of inverse lattice-dislocated layers 118 are provided in addition to the lattice-dislocated layers 115 in the fifth embodiment, that is, these inverse lattice-dislocated layers 118 and lattice-dislocated layers 115 are alternately provide in the second clad layer 108 near the interface with the second guide layer 107. Each inverse lattice-dislocated layer 118 has a smaller lattice constant than that of the second clad layer 108 to trap inter-lattice-type point defects 116 in the second clad layer 108 and thus to suppress the movement of the point defects 116 towards the active layer 106. The direction of the shift of the lattice constant of the inverse lattice-dislocated layer 118 to the second clad layer 108 is opposite that of the lattice-dislocated layer 115 to the second clad layer 108. An excessively great difference in the lattice constant between the lattice-dislocated layer 118 and the second clad layer 108 causes the formation of new defects, hence it is preferable that the difference be 10% or less.

The thickness of each inverse lattice-dislocated layer 118 is preferably 10 nm or less, and more preferably 10 atomic layers or less in order to constrain the movement and coagulation of point defects 116 trapped in the inverse lattice-dislocated layer 118. The total thickness of the inverse lattice-dislocated layers 118 and the lattice-dislocated layers 115 must be within the critical thickness of the second clad layer 108. The inverse lattice-dislocated layers 118 are at least 50 nm distant from the active layer 106. Each inverse lattice-dislocated layer 118 is composed of p-ZnSe, or a p-ZnSSe or p-ZnBeSe mixed crystal which are doped with nitrogen as a p-type impurity. In the p-ZnSSe mixed crystal, the sulfur content in the Group VI elements is 6% or more.

The luminescent semiconductor device having such a configuration is produced as in the fifth embodiment. Each lattice-dislocated layer 115 and inverse lattice-dislocated layer 118 are deposited by alternately feeding Group II elements and Group VI elements in this embodiment.

The resulting luminescent semiconductor device functions as follows. The lattice-dislocated layers 115 inhibit migration of the point defects 116 towards the active layer 106, as in the fifth embodiment. Further, the point defects 116 are trapped in the inverse lattice-dislocated layer 118 having a smaller lattice constant than that of the second clad layer 108. If some point defects pass through a lattice-dislocated layer 115, they are trapped in a stable state with a inverse lattice-dislocated layer 117 which is intervened between two lattice-dislocated layers 115, and do no reach near the active layer 6.

In accordance with the luminescent semiconductor device in this embodiment, as described above, lattice-dislocated layers 115 having a larger lattice constant than that of the second clad layer 108 and inverse lattice-dislocated layers 118 having a smaller lattice constant than that of the second clad layer 108 are alternately intervened in the second clad layer 108. The movement of the point defects 116 in the second clad layer 108 towards the active layer 106 is therefore more effectively suppressed.

[Eighth Embodiment]

An optical disk apparatus in accordance with an eighth embodiment of the present invention will now be described. The optical disk apparatus is provided with a luminescent semiconductor device in accordance with the present invention and is used for reproducing information recorded on optical discs.

Figure 17:
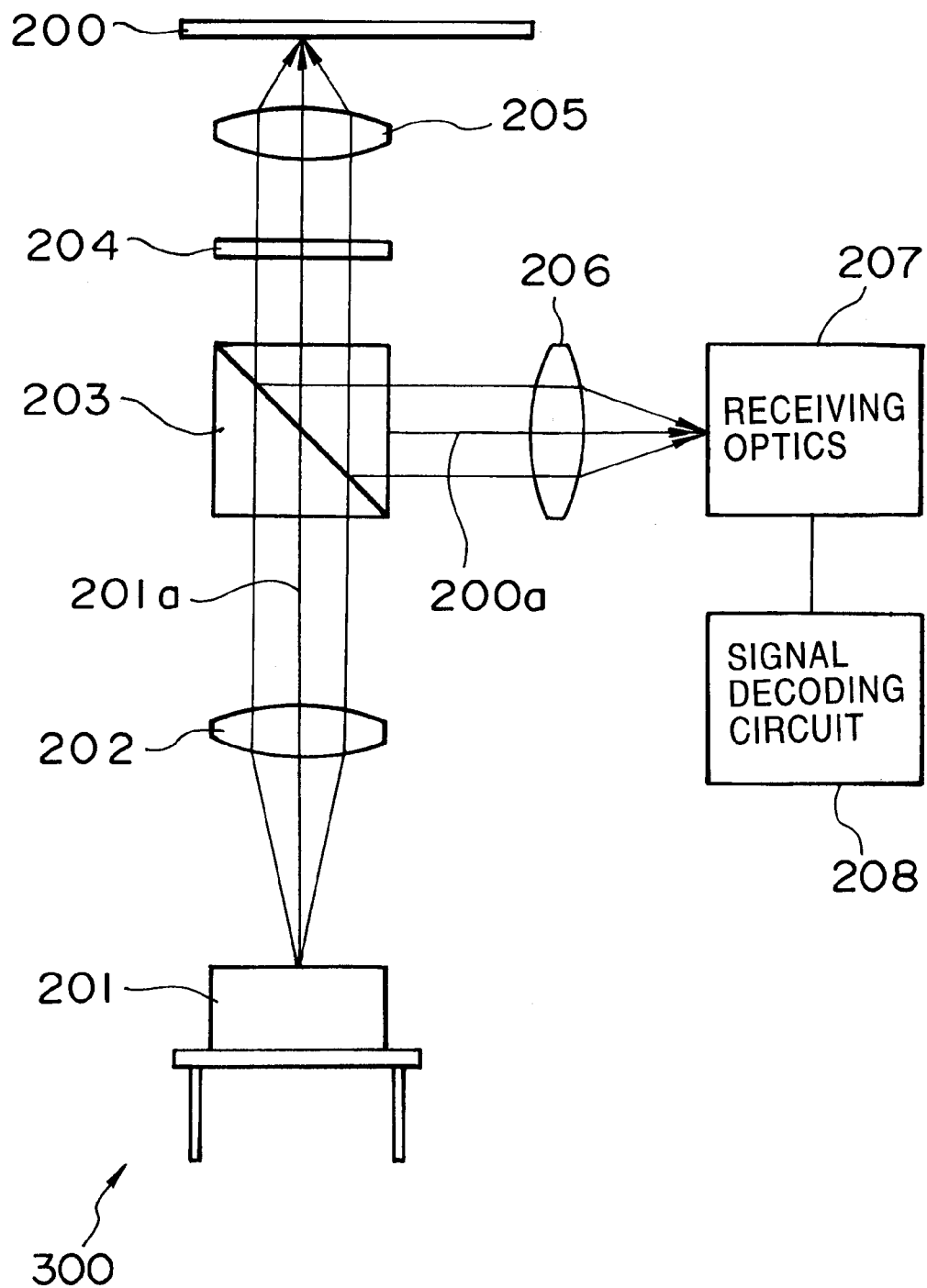
FIG. 17 is a schematic configurational view of an optical reproducing disk apparatus in accordance with an eighth embodiment of the present invention.

FIG. 17 is a schematic view of an optical reproducing disk apparatus 300. The optical reproducing disk apparatus 300 reproduces information recorded on an optical disc 200, and is provided with a luminescent semiconductor device 201 which emits green or blue light. The luminescent semiconductor device 201 may be a luminescent semiconductor device described in the first or second embodiment, or may be a luminescent semiconductor device produced by a method described in the third embodiment. The optical reproducing disk apparatus 300 is provided with an optical system, which conducts the light emitted from the luminescent semiconductor device 201 onto the optical disc 200 and decodes the light (signal light 200a) reflected by the optical disc 200, that is, a collimating lens 202, a beam splitter 203, a ¼ wavelength plate 204, an objective lens 205, a detector lens 206, a receiving optoelectronic device 207 for detecting the signal light from the optical disc 200, and a signal decoding circuit 208.

The light emitted from the luminescent semiconductor device 201 is collimated with the collimating lens 202, polarized with the ¼ wavelength plate 204 through the beam splitter 203, collected on the objective lens 205, and radiated on the optical disc 200. The signal light 200a reflected by the optical disc 200 is reflected through the objective lens 205 and the ¼ wavelength plate 204, reflected by the beam splitter 203, and radiated on the receiving optoelectronic device 207 through the detecting lens 206. The light is converted into electrical signals and reproduced as the recorded information by the signal decoding circuit 208.

In the luminescent semiconductor device 201 in accordance with the present invention, as described, diffusion of the constituents from the active layer 7 is prevented, and the shift of the emitted light to a shorter wavelength with time is prevented. An increasing operational current flow is thereby improved, resulting in a prolonged life of the luminescent semiconductor device 201. Accordingly, the lives of the optical disc 200 and the optical reproducing disk apparatus 300 can also be prolonged by providing the luminescent semiconductor device 201 in the optical reproducing disk apparatus 300.

Although the luminescent semiconductor device in accordance with the present invention is applied to the optical reproducing disk apparatus in this embodiment, the device is also applicable to other optical apparatuses, such as optical recording disk apparatuses and optical recording/regenerating disk apparatuses, and vehicle apparatuses provided with semiconductor laser units which are operated at high temperatures.

The present invention is not limited to the abovementioned embodiments and can have various modifications. For example, the active layer 7 in the first and second embodiment can be composed of a Group II–VI compound semiconductor containing at least one element of cadmium, beryllium and magnesium as a Group II element and tellurium as a Group VI element instead of the above-described ZnCdSe mixed crystal. In the present invention, diffusion of these elements affecting the characteristics of the active layer 7 is effectively prevented.

Although some examples of the antidiffusion layer material are described in the first and second embodiments, the antidiffusion layers 6 and 8 can be composed of another Group II–VI compound semiconductor containing at least one Group II element selected from the group consisting of zinc, magnesium cadmium mercury and beryllium, and at least one Group VI element selected from the group consisting of oxygen, selenium, sulfur and tellurium.

Although the antidiffusion layers 6 and 8 contain no impurity in the first and second embodiments, these layers may contain an appropriate amount of impurity in the present invention.

A method for making the luminescent semiconductor device is described in the third embodiment. The method is also applicable to luminescent semiconductor devices having other configurations, for example, the luminescent semiconductor devices described in the first and second embodiments.

In this case, regions, facing the active layer 7, of the antidiffusion layers 6 and 8 are deposited while the dose of the particle beams of the Group VI elements is decreased compared to the dose of the particle beams of the Group II elements. When the antidiffusion layers 6 and 8 have a small thickness of, for example, 5 nm, it is preferable that the entire antidiffusion layers 6 and 8 are deposited while the dose of the particle beams of the Group II elements is increased, and regions, facing the active layer 7, of the first and second guide layers 5 and 9 are deposited while the dose of the particle beams of the Group VI elements is decreased. Such regions of the first and second guide layers 5 and 9 preferably are at distances of at most 10 nm from the active layer 7, that is, when the antidiffusion layers 6 and 8 have a thickness of 5 nm, the regions are at distance of at most 5 nm from the active layer 7.

The above-mentioned embodiments may be modified in the present invention. For example, although a plurality of lattice-dislocated layers 113 (115), or a plurality of lattice-dislocated layers 115 and a plurality of inverse lattice-dislocated layers 118 are provided in the embodiments, the present invention also includes a single lattice-dislocated layer, and a combination of a single lattice-dislocated layer and a single inverse lattice-dislocated layer.

The composition of each deposited layer is described in the above-mentioned embodiments. The present invention is also applicable to deposited layers composed of other Group II–VI compound semiconductors or other Group III–V compound semiconductors. In particular, the present invention is suitable for depositing a layer, such as a first clad layer, a first guide layer, an active layer, a second guide layer, or a second clad layer, composed of a Group II–VI compound semiconductor containing at least one Group II element selected from the group consisting of zinc, magnesium cadmium, mercury and beryllium, and at least one Group VI element selected from the group consisting of selenium, sulfur and tellurium.

When the active layer 106 is formed of a ZnSeTe mixed crystal in the fourth embodiment, the lattice-dislocated layer 113 can be formed of a ZnMgSSe or ZnBeMgSe mixed crystal. In the fourth embodiment, although the lattice-dislocated layers 113 having a smaller lattice constant than that of the active layer 106 are intervened in the active layer 106, the lattice constant of the lattice-dislocated layers 113 may be larger than that of the active layer 106 in some compositions of the active layer 106. In this case, hole-type point defects are trapped in the lattice-dislocated layer.

In the above-mentioned fifth to seventh embodiments, lattice-dislocated layers 115, or lattice-dislocated layers 115 with inverse lattice-dislocated layers 118 are intervened in the second clad layers 108. These layers may be intervened in other deposited layers, for example, the second guide layer 107 and the first electrode layer 9.

In the above-mentioned fourth to seventh embodiments, inter-lattice point defects 116 are described. These embodiments are also effective for suppressing the movement of hole-type point defects, which are present in some deposited layers or some deposition processes. The hole-type point defects, however, are stably present at different positions from the position in which inter-lattice point defects are present, that is, the movement of the hole-type defects is suppressed by a reduced lattice constant of the lattice-dislocated layer to the deposited layer, rather than an increased lattice constant of the lattice-dislocated layer in the second embodiment. For example, when the substrate is composed of GaAs, the lattice-dislocated layer is composed of an impurity-doped ZnSSe or ZnBeSe mixed crystal. In the ZnSSe mixed crystal, the sulfur content is 6% or more in the Group VI elements.

In the sixth embodiment, the lattice constant of the lattice-dislocated layer may be larger than that of the deposited layer. Such a configuration also show the same advantages as in the sixth embodiment. For example, when the substrate is composed of GaAs, the lattice-dislocated layer may be composed of an impurity-doped ZnMgSe, ZnCdSe or ZnMgCdSe mixed crystal. Also, in the seventh embodiment, the lattice constant of the lattice-dislocated layer may be larger than that of the deposited layer.

In the seventh embodiment, the lattice-dislocated layer 115 and the inverse lattice-located layer 118 adjoin each other in the second clad layer 108. Instead of this, the lattice-dislocated layer 115 and the inverse lattice-located layer 118 may be intervened in the second clad layer 108 at a given distance.

In the above-mentioned embodiments, the active layer 106 is provided between the guide layers 105 and 107, and these are sandwiched with the clad layers 104 and 108. The present invention is also applicable to luminescent semiconductor devices not having guide layers, or having other configurations.

In the above-mentioned embodiments, each layer is deposited by a solid-source MBE process. Other deposition processes by particle beam irradiation, for example, a gas-source MBE process, are also applicable to the present invention.

As describe above, the luminescent semiconductor device in accordance with the present invention is provided with an antidiffusion layer on at least one face of the active layer. The constituents in the active layer do not diffuse by energizing, and thus the luminescent light does not shift t o a shorter wavelength. The carrier overflow due to an increase d band gap in the active layer therefore does not occur, and an increased operating current and a decreased characteristic temperature are prevented. The occurrence of DLD and an increase in non-luminescent recombination centers can be prevented. Thus, an increased operating current is prevented. Further, the half-width of the emission spectrum does not increase, and a high gain is obtained without increasing the operating current.

In accordance with the method for making the luminescent semiconductor of the present invention, the fed amount of the Group VI elements to the fed amount of the Group II elements is decreased during deposit the active layer 7 and at least one surface, facing the active layer, of at least one Group II–VI compound semiconductor layer which adjoins the active layer. Thus, the method enables the production of a luminescent semiconductor device without diffusion of the constituents from the active layer by energizing and shift of the luminescent light to a shorter wavelength.

The optical disk apparatus in accordance with the present invention employs the luminescent semiconductor device in accordance with the present invention. The life of the optical disk apparatus is prolonged as the life of the luminescent semiconductor device is prolonged.

In accordance with the luminescent semiconductor device of the present invention, at least one lattice-dislocated layer having a thickness of 10 nm or less and a dislocated lattice constant is provided in at least one deposited layer, hence the movement of the point defects in the deposited layer can be restrained. Coagulation or increase of the point defects can therefore be suppressed, and thus an increase in non-luminescent recombination centers can be suppressed. Accordingly, the life of the luminescent semiconductor device is prolonged.

In accordance with the method for making the luminescent semiconductor device of the present invention, the lattice-dislocated layer is deposited by alternately feeding a first element and a second element. The lattice-dislocated layer can therefore be deposited with high accuracy.

What is claimed is:

1. A luminescent semiconductor device comprising:
an active layer comprising a Group II–VI semiconductor device comprising at least one Group II element selected from the group consisting of zinc, magnesium, beryllium, cadmium, manganese and mercury, and at least one Group VI element selected from the group consisting of oxygen, sulfur, selenium and tellurium; and at least one antidiffusion layer preventing diffusion of these elements from said active layer, said antidiffusion layer being provided on at least one surface of said active layer.

2. A luminescent semiconductor device according to claim 1, wherein said antidiffusion layer comprises a material having a higher melting point than that of the material forming said active layer.

3. A luminescent semiconductor device according to claim 2, wherein said antidiffusion layer has a melting point of 1,830° C. or more.

4. A luminescent semiconductor device according to claim 2, wherein said material forming said antidiffusion layer is a Group II–VI compound semiconductor comprising at least Group II element selected from the group consisting of zinc, magnesium beryllium, cadmium, manganese and mercury, and at least one Group VI element selected from the group consisting of oxygen, sulfur, selenium and tellurium.

5. A luminescent semiconductor device according to claim 4, wherein said Group II–VI compound semiconductor forming said antidiffusion layer contains at least magnesium as the Group II element.

6. A luminescent semiconductor device according to claim 4, wherein said Group II–VI compound semiconductor forming said antidiffusion layer contains at least beryllium as the Group II element.

7. A luminescent semiconductor device according to claim 4, wherein said Group II–VI compound semiconductor forming said antidiffusion layer contains at least one element among magnesium and beryllium as the Group II element, and at least one element among sulfur and selenium as the Group VI element.

8. A luminescent semiconductor device according to claim 7, wherein said Group II–VI compound semiconductor forming said active layer contains at least one Group II element selected from the group consisting of zinc and cadmium, and at least one Group VI element selected from the group consisting of sulfur and selenium, and has a quantum well structure.

9. A luminescent semiconductor device according to claim 1, wherein said antidiffusion layer comprises a material having a larger activation energy for diffusion than that of the material forming said active layer.

10. A luminescent semiconductor device according to claim 1, wherein said Group II–VI compound semiconductor forming said active layer has a lattice distortion, and said antidiffusion layer comprises a crystalline material having a lattice distortion in the same direction as said active layer.

11. A luminescent semiconductor device according to claim 10, wherein said crystalline material is a Group II–VI compound semiconductor comprising at least one Group II element selected from the group consisting of zinc, magnesium, beryllium, cadmium, manganese and mercury, and at least one Group VI element selected from the group consisting of oxygen, sulfur, selenium and tellurium.

12. A luminescent semiconductor device according to claim 11, wherein said Group II–VI compound semiconductor forming said antidiffusion layer comprises at least one Group II element selected from the group consisting of zinc, magnesium and beryllium, and at least one Group VI element selected from the group consisting of sulfur and selenium.

13. A luminescent semiconductor device according to claim 12, wherein said Group II–VI compound semiconductor forming said active layer contains at least one element among zinc and cadmium as the Group II element, and sulfur and selenium as the Group VI element.

14. A luminescent semiconductor device according to claim 1, wherein said Group II–VI compound semiconductor forming said active layer has a lattice distortion, said antidiffusion layer has a lattice distortion in the same direction as that of said active layer and comprises a crystalline material having a higher melting point than that of the material forming said active layer.

15. An optical recording device comprising: a luminescent semiconductor device comprising a Group II–VI compound semiconductor active layer comprising at least one Group II element selected from the group consisting of zinc, magnesium, beryllium, cadmium and mercury, and at least one Group VI element selected from the group consisting of oxygen, sulfur, selenium and tellurium, wherein at least one antidiffusion layer preventing diffusion of these elements from the active layer is provided on at least one surface of the active layer.

16. A luminescent semiconductor device comprising a substrate and a plurality of deposited layers overlaid on said substrate;
wherein,
at least one deposited layer is provided with at least one lattice-dislocated layer having a lattice constant difference relative to said deposited layer and having a thickness of 10 nm or less.

17. A luminescent semiconductor device according to claim 16, wherein the difference in the lattice constant between said deposited layer and said lattice-dislocated layer is 10% or less.

18. A luminescent semiconductor device according to claim 16, wherein said lattice-dislocated layer has a thickness 10 atomic layers or less per layer.

19. A luminescent semiconductor device according to claim 18, wherein one layer among said deposited layers is an active layer provided with said lattice-dislocated layer.

20. A luminescent semiconductor device according to claim 19, wherein the difference in the lattice constant between said active layer and said lattice-dislocated layer is 10% or less.

21. A luminescent semiconductor device according to claim 19, wherein said lattice-dislocated layer has a thickness of 3 atomic layer or less.

22. A luminescent semiconductor device according to claim 19, wherein at least one distance of a distance between two adjacent lattice-dislocated layers in said active layer and a distance between said lattice-dislocated layer and a deposited layer adjoining said active layer is 10 atomic layers or less.

23. A luminescent semiconductor device according to claim 19, wherein said active layer comprises a Group II–VI compound semiconductor device containing at least one Group II element selected from the group consisting of zinc and cadmium, and selenium as a Group VI element, said lattice-dislocated layer comprises a Group II–VI compound semiconductor device containing zinc as a Group II element and at least one Group VI element selected from the group consisting of sulfur and selenium.

24. A luminescent semiconductor device according to claim 16, wherein the total thickness of said lattice-dislocated layer is smaller than the critical thickness to the lattice constant of said deposited layer.

25. A luminescent semiconductor device according to claim 16, wherein said deposited layer is provided with a plurality of lattice-dislocated layers, and a distance between two adjacent lattice-dislocated layers in said deposited layer is 10 nm or less.

26. A luminescent semiconductor device according to claim 16, wherein said deposited layer is provided with a plurality of lattice-dislocated layers, and a distance between two adjacent lattice-dislocated layers in said deposited layer is 10 atomic layers or less.

27. A luminescent semiconductor device according to claim 16, wherein at least one deposited layer is provided with at least one lattice-dislocated layer and at least one inverse lattice-dislocated layer which has a lattice constant difference relative to said deposited layer and a thickness of 10 nm or less, the directions of the dislocation of said lattice-dislocated layer and said inverse lattice-dislocated layer being opposite each other.

28. A luminescent semiconductor device according to claim 27, wherein a plurality of said lattice-dislocated layers and a plurality of said inverse lattice-dislocated layers are alternately provided.

29. A luminescent semiconductor device according to claim 27, wherein the difference in the lattice constant between said deposited layer and said inverse lattice-dislocated layer is 10% or less.

30. A luminescent semiconductor device according to claim 27, wherein said deposited layer is provided with a plurality of inverse lattice-dislocated layers, and a distance between two adjacent inverse lattice-dislocated layers in said deposited layer is 10 atomic layers or less.

31. A luminescent semiconductor device according to claim 27, wherein the total thickness of said lattice-dislocated layer and said inverse lattice-dislocated layer is smaller than the critical thickness to the lattice constant of said deposited layer.

32. A luminescent semiconductor device according to claim 27, wherein said deposited layers include at least one layer of a guide layer and a clad layer, and said at least one layer is provided with a plurality of lattice-dislocated layer and a plurality of inverse lattice-dislocated layer.

33. A luminescent semiconductor device according to claim 32, wherein the difference in the lattice constant between said at least one layer of said guide layer and said clad layer and said lattice-dislocated layer and said inverse lattice-dislocated layer is 10% or less.

34. A luminescent semiconductor device according to claim 32, wherein at least one layer of said lattice-dislocated layer and said inverse lattice-disordered layer has a thickness of 10 atomic layers or less.

35. A luminescent semiconductor device according to claim 32, wherein the total thickness of said lattice-dislocated layer and said inverse lattice-dislocated layer in said guide layer or said clad layer is smaller than the critical thickness to the lattice constant of said guide layer or said clad layer.

36. A luminescent semiconductor device according to claim 32, wherein said lattice-dislocated layer and said inverse lattice-dislocated layer are at a distance of 50 nm or more from said active layer.

37. A luminescent semiconductor device according to claim 16, wherein said deposited layer comprises a Group II–VI compound semiconductor layer comprising at least one group II element selected from the group consisting of zinc, magnesium, beryllium, cadmium and mercury, and at least one group VI element selected from the group consisting of sulfur, selenium and tellurium.

38. A luminescent semiconductor device according to claim 16, wherein said plurality of deposited layers include at least one layer of a guide layer and a clad layer, and said at least one layer of said guide layer and said clad layer is provided with said lattice-dislocated layer.

39. A luminescent semiconductor device according to claim 38, wherein the difference in the lattice constant between said at least one layer of said guide layer and said clad layer and said lattice-dislocated layer is 10% or less.

40. A luminescent semiconductor device according to claim 38, wherein said lattice-dislocated layer has a thickness of 10 atomic layers or less.

41. A luminescent semiconductor device according to claim 38, wherein the total thickness of said lattice-dislocated layer in said guide layer or said clad layer is smaller than the critical thickness to the lattice constant of said guide layer or said clad layer.

42. A luminescent semiconductor device according to claim 38, wherein the distance between said lattice-dislocated layers in said guide layer or said clad layer is 10 nm or less.

43. A luminescent semiconductor device according to claim 38, wherein said lattice-dislocated layer is at a distance of 50 nm or more from said active layer.

44. A luminescent semiconductor device according to claim 38, wherein said lattice-dislocated layer comprises a Group II–VI compound semiconductor comprising at least one Group II element selected from the group consisting of zinc, magnesium and cadmium, and selenium as a Group VI element.

45. A luminescent semiconductor device according to claim 38, wherein said lattice-dislocated layer comprises a Group II–VI compound semiconductor comprising zinc as a Group II element and sulfur as a Group VI element.

46. A luminescent semiconductor device according to claim 38, wherein said plurality of lattice-dislocated layer and said plurality of inverse lattice-dislocated layer are alternately provided.

* * * * *